US008386975B2

(12) United States Patent
White et al.

(10) Patent No.: US 8,386,975 B2
(45) Date of Patent: Feb. 26, 2013

(54) METHOD, SYSTEM, AND COMPUTER PROGRAM PRODUCT FOR IMPROVED ELECTRICAL ANALYSIS

(75) Inventors: David White, San Jose, CA (US); Matthew Liberty, Lake Oswego, OR (US); Eric Nequist, Monte Sereno, CA (US); Michael McSherry, Portland, OR (US)

(73) Assignee: Cadence Design Systems, Inc., San Jose, CA (US)

( * ) Notice: Subject to any disclaimer, the term of this patent is extended or adjusted under 35 U.S.C. 154(b) by 783 days.

(21) Appl. No.: 12/344,327

(22) Filed: Dec. 26, 2008

(65) Prior Publication Data

US 2009/0199139 A1 Aug. 6, 2009

Related U.S. Application Data

(60) Provisional application No. 61/017,155, filed on Dec. 27, 2007.

(51) Int. Cl.
*G06F 17/50* (2006.01)
(52) U.S. Cl. ..................................... 716/108
(58) Field of Classification Search ............... 716/106
See application file for complete search history.

(56) References Cited

U.S. PATENT DOCUMENTS

| 6,449,754 | B1 * | 9/2002 | You et al. ................ 716/115 |
| 7,299,428 | B2 * | 11/2007 | Ma et al. ................. 716/112 |
| 7,665,045 | B1 | 2/2010 | Nequist |
| 7,814,447 | B2 | 10/2010 | Scheffer et al. |
| 7,870,517 | B1 | 1/2011 | Nequist et al. |
| 7,937,674 | B2 | 5/2011 | White et al. |
| 8,001,512 | B1 | 8/2011 | White |
| 8,069,426 | B2 | 11/2011 | Nequist |
| 8,122,392 | B2 | 2/2012 | White et al. |
| 8,136,060 | B1 | 3/2012 | Nequist |
| 2004/0073879 | A1 * | 4/2004 | Chen et al. ................ 716/8 |
| 2011/0046767 | A1 | 2/2011 | Scheffer et al. |
| 2011/0093826 | A1 | 4/2011 | White et al. |
| 2011/0314432 | A1 | 12/2011 | Cross et al. |
| 2012/0022846 | A1 | 1/2012 | White et al. |
| 2012/0023465 | A1 | 1/2012 | Gopalakrishnan et al. |
| 2012/0023467 | A1 | 1/2012 | McSherry et al. |
| 2012/0023468 | A1 | 1/2012 | Fischer et al. |
| 2012/0023471 | A1 | 1/2012 | Fischer et al. |
| 2012/0023472 | A1 | 1/2012 | Fischer et al. |
| 2012/0131524 | A1 | 5/2012 | Nequist |
| 2012/0151422 | A1 | 6/2012 | White et al. |

OTHER PUBLICATIONS

Weisstein, Eric W. "Newton's Method." From MathWorld—A Wolfram Web Resource. http://mathworld.wolfram.com/NewtonsMethod.html, Accessed on Jul. 4, 2012.

* cited by examiner

*Primary Examiner* — Jack Chiang
*Assistant Examiner* — Brandon Bowers
(74) *Attorney, Agent, or Firm* — Vista IP Law Group, LLP

(57) ABSTRACT

An improved method, system, user interface, and computer program product is described for using a memory and learning component to improve capacitance and resistance estimates based on the types of layouts and devices being evaluated. According to some approaches, a learning component is implemented that uses recommended test sets from the evaluation component to automatically test the extraction estimates against the field solver. Variability models from manufacturing or electrical analysis may also be used to select a series of objects (unique conductor geometries) that make up a conduction path or net or specific conductor geometries for evaluation and additional learning improvement.

50 Claims, 24 Drawing Sheets

Learning Scheme for Extraction

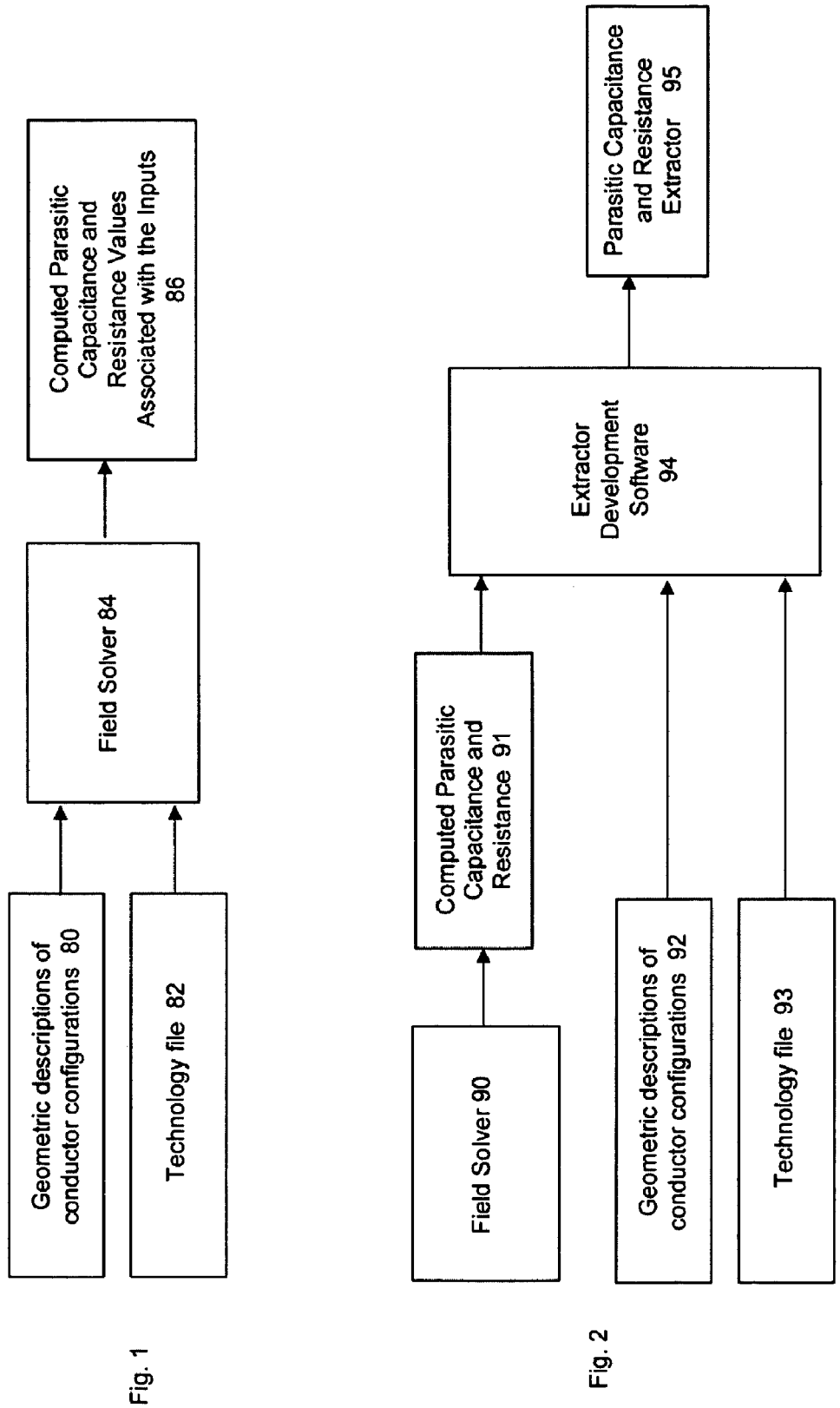

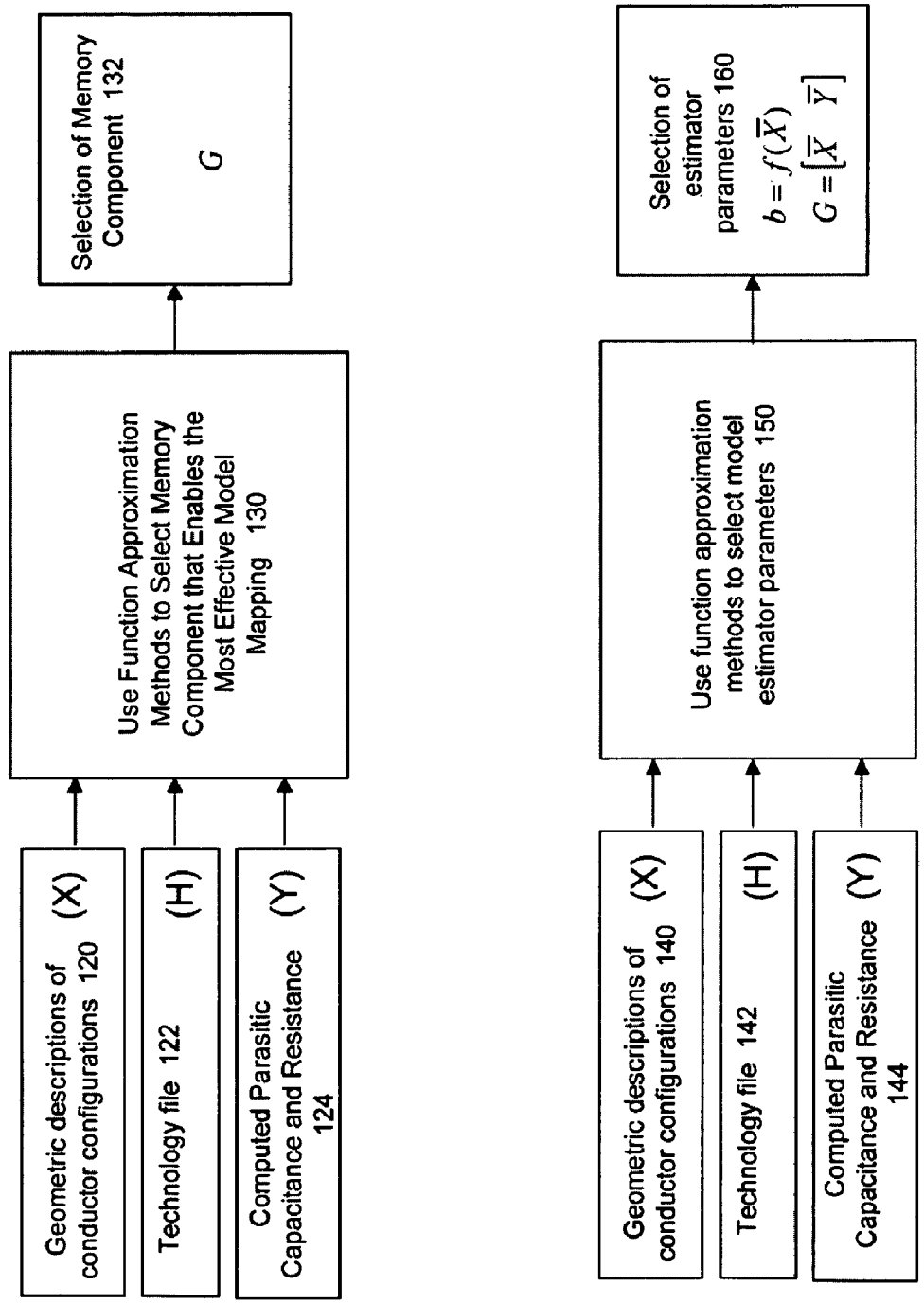

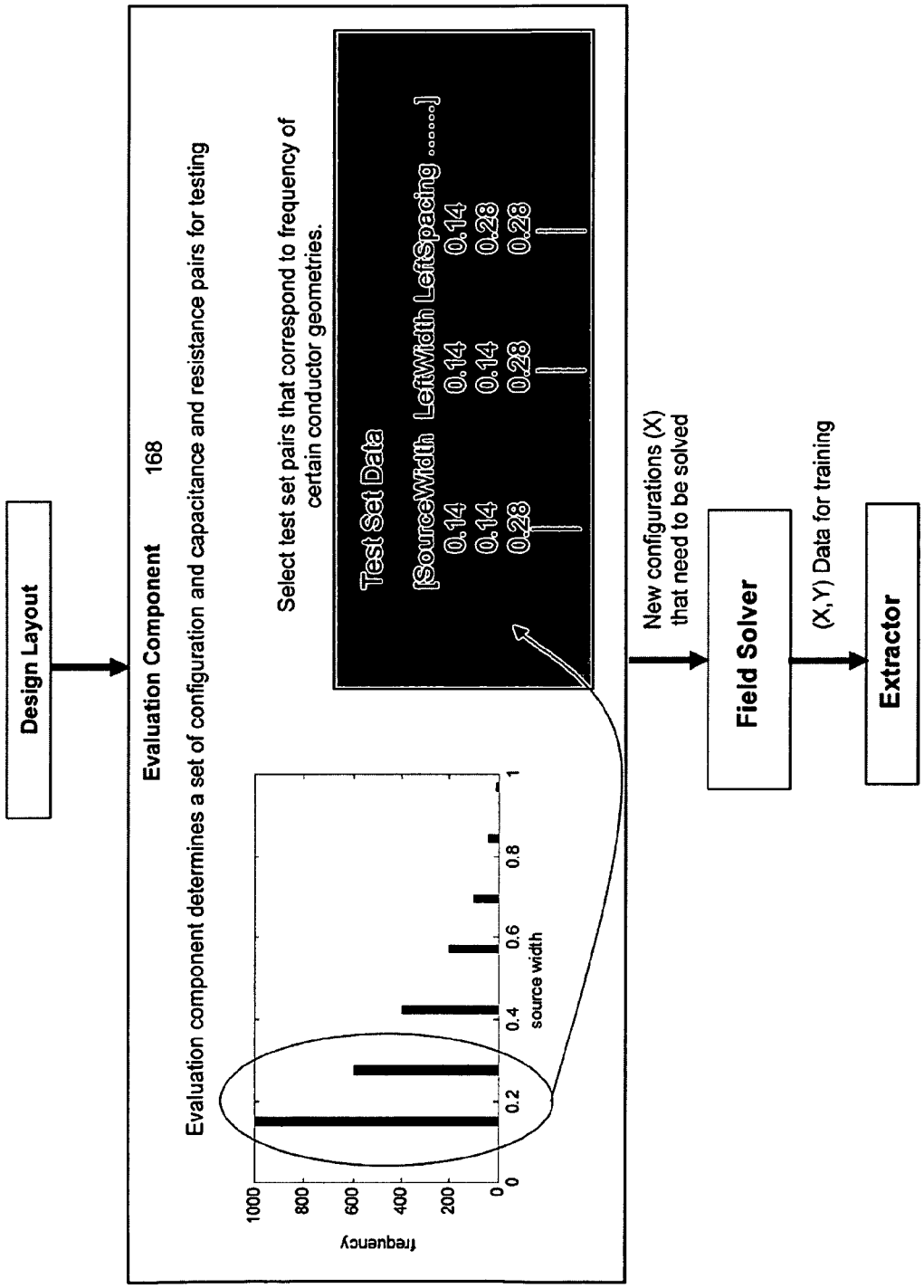

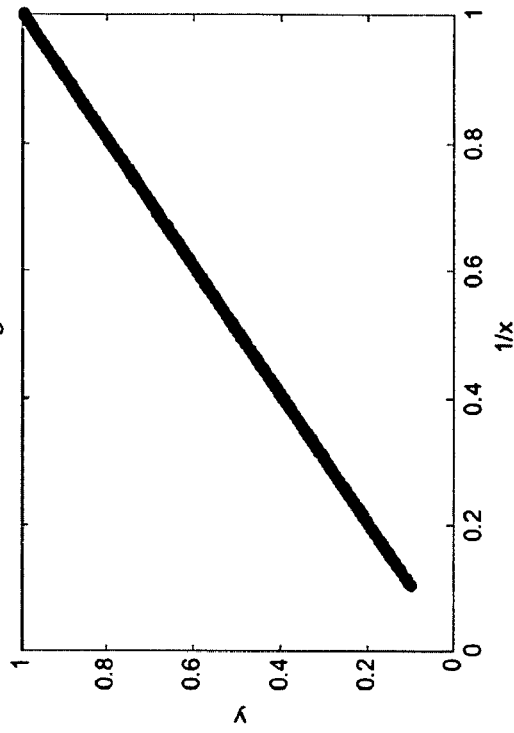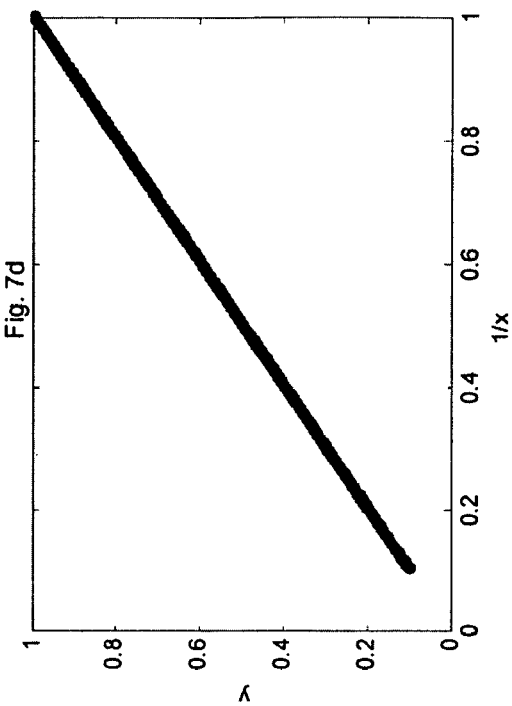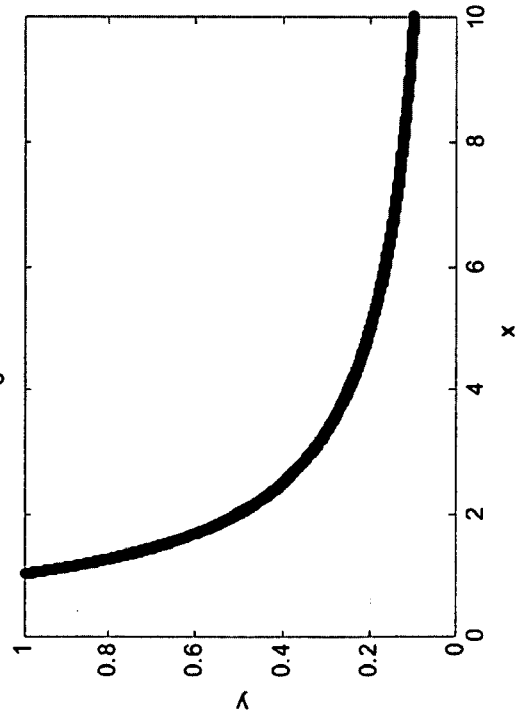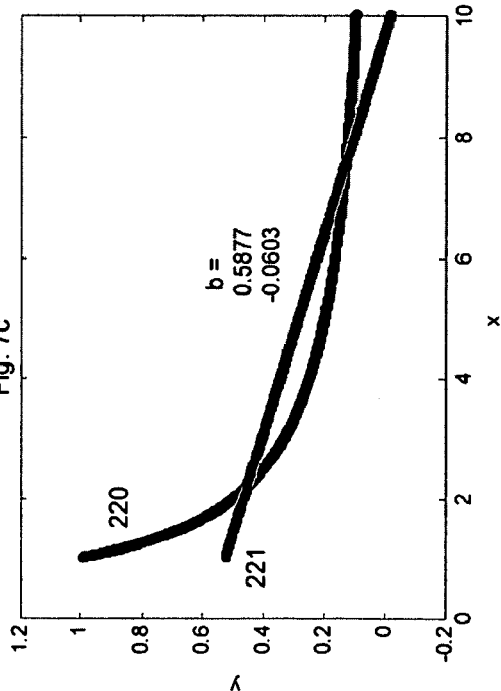

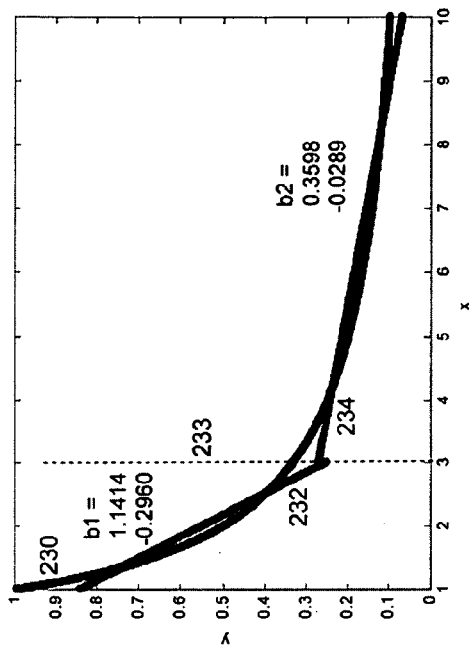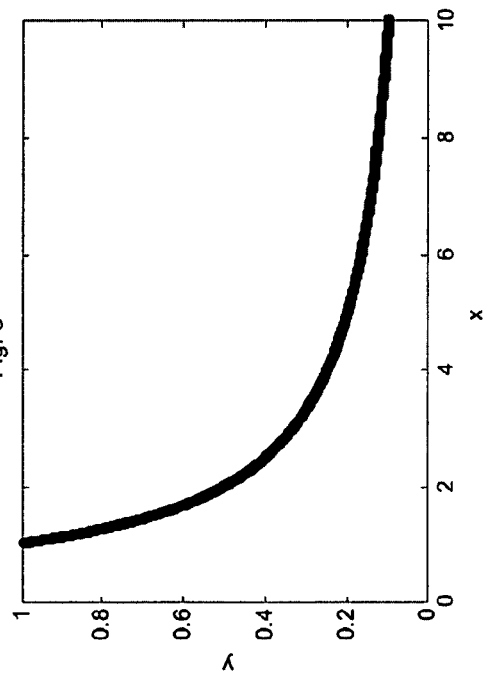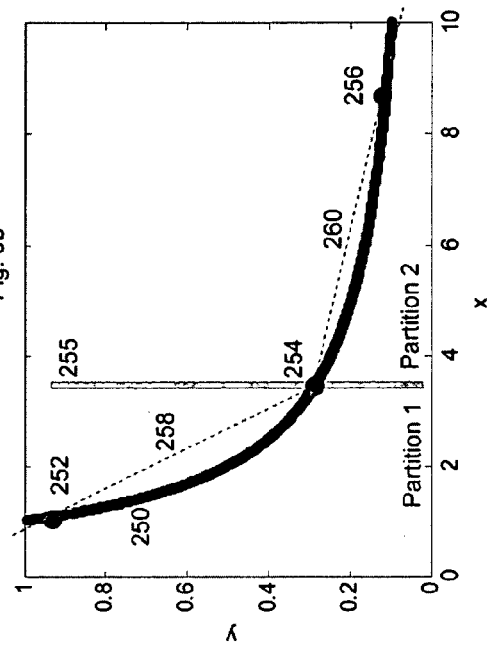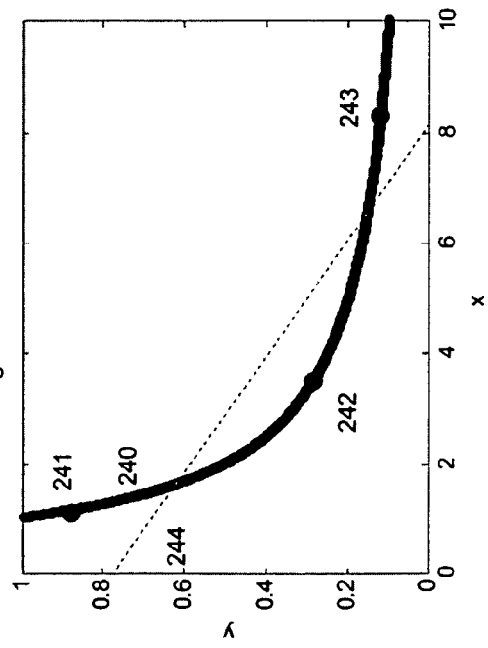

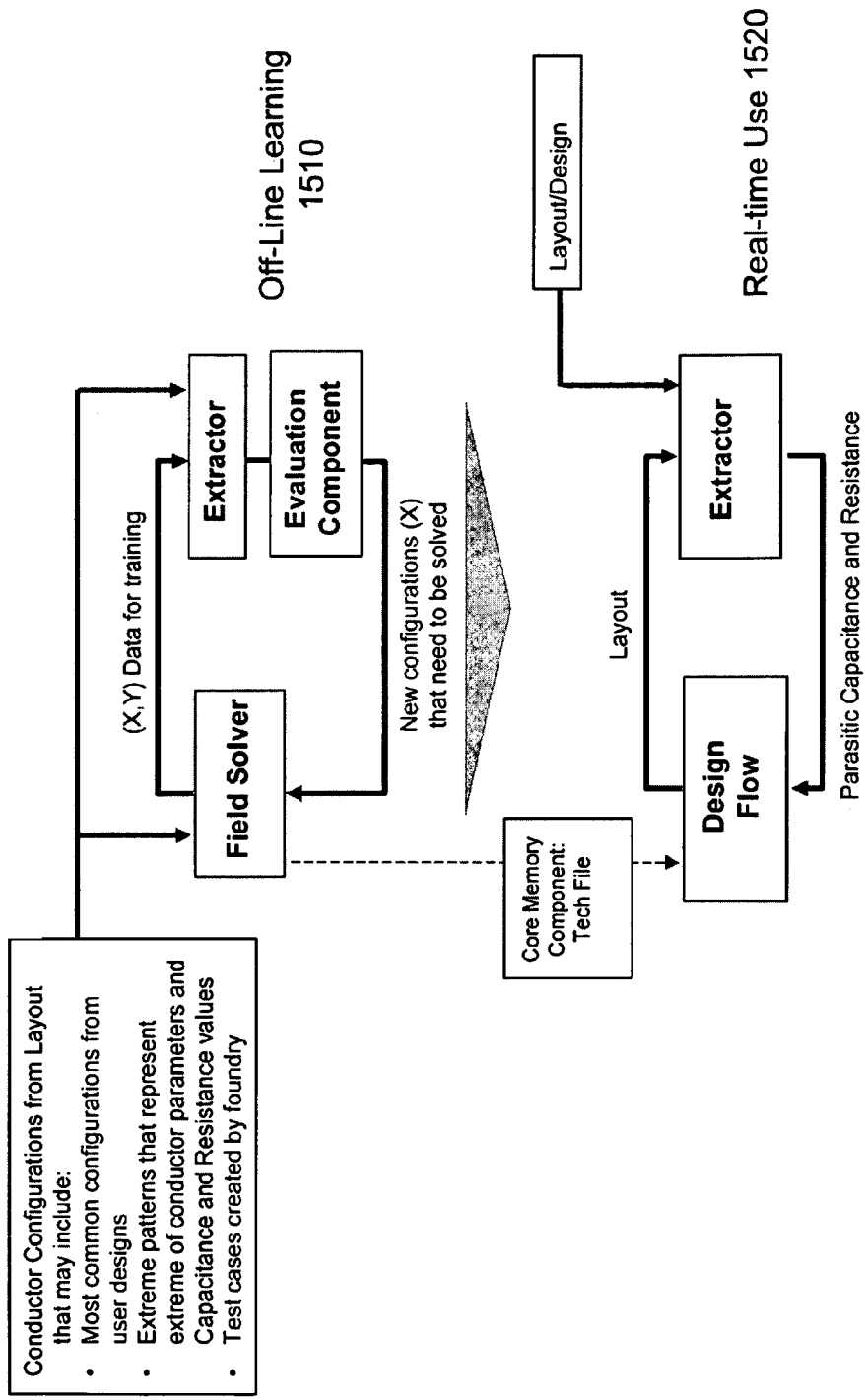

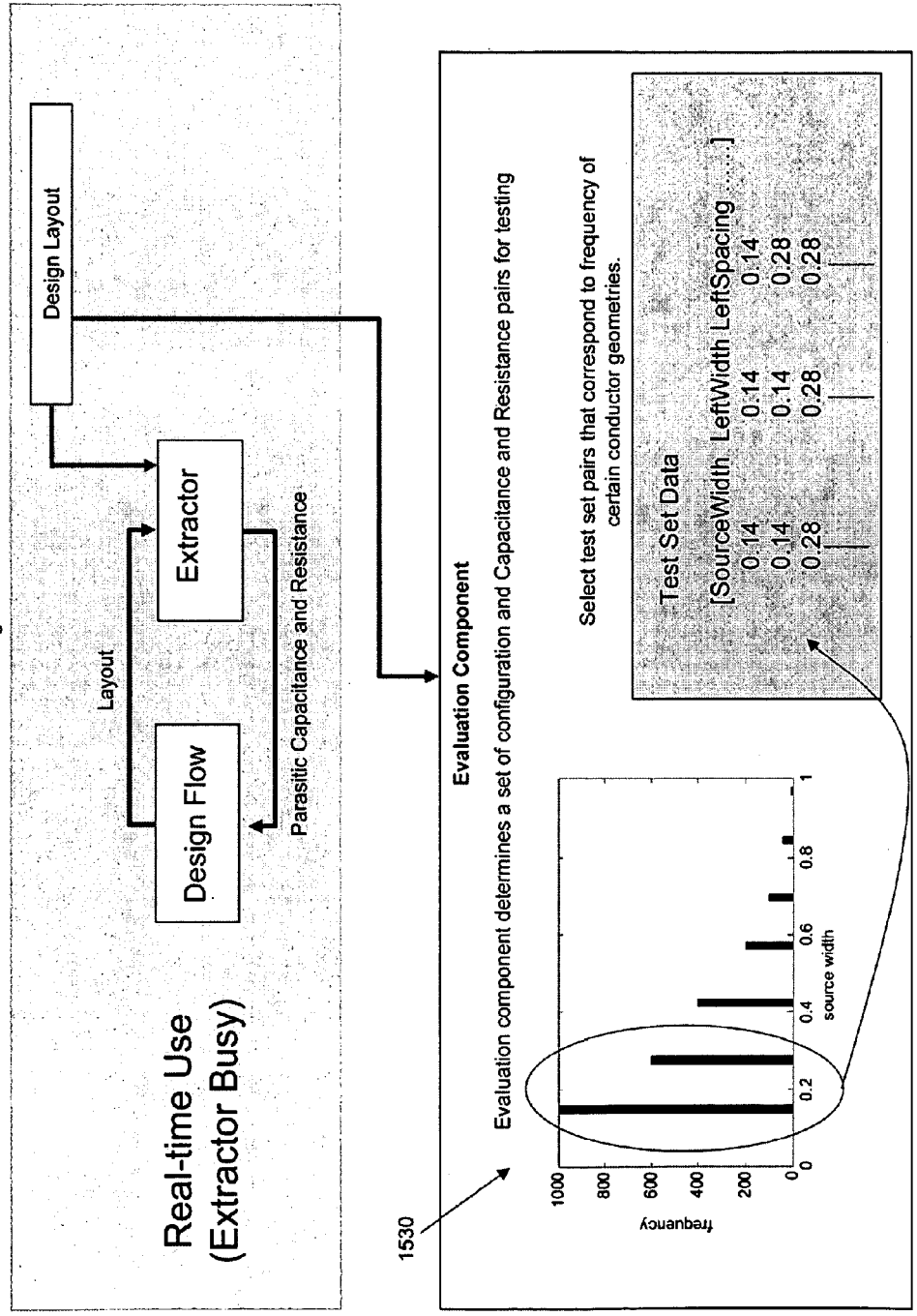

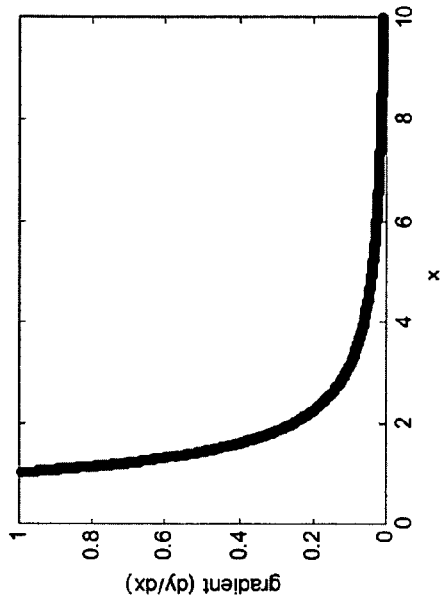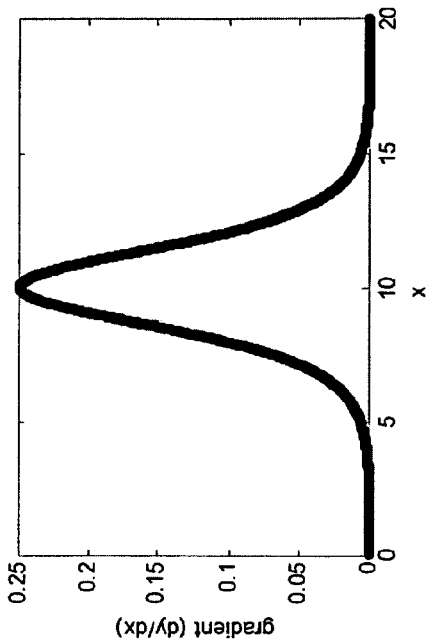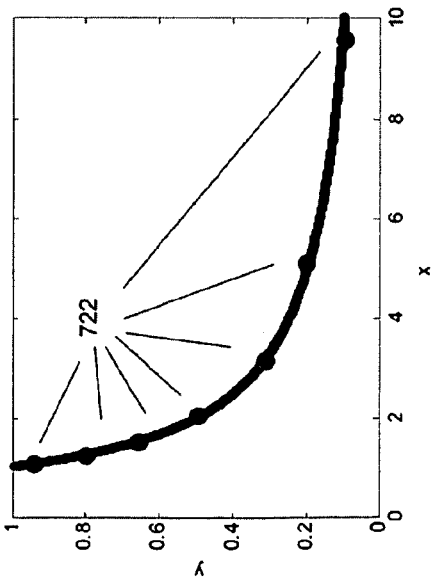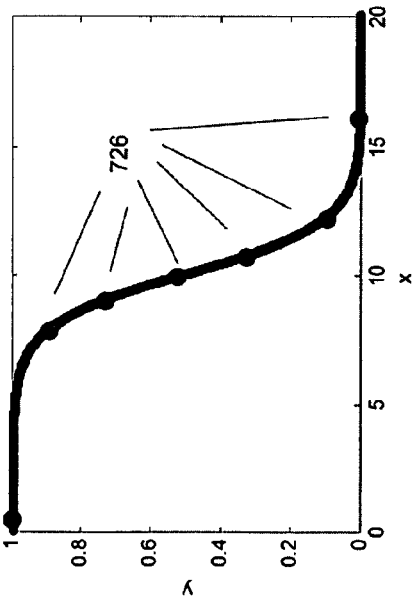

Use Case

METHOD, SYSTEM, AND COMPUTER PROGRAM PRODUCT FOR IMPROVED ELECTRICAL ANALYSIS

CROSS-REFERENCE TO RELATED APPLICATIONS

The present application claims the benefit of U.S. Provisional Application Ser. No. 61/017,155, filed on Dec. 27, 2007, which is hereby incorporated by reference in its entirety.

BACKGROUND

The invention relates to technology for performing electrical analysis of an electronic design.

A field solver is often used to perform electrical analysis of a design. A field solver comprises software and/or hardware that translates a geometric description of conductor and insulator objects, or other shapes described in an IC design file or database, to associated parasitic capacitances values. The capacitance values may include total capacitance of a single conductor, defined as the source conductor, relative to neighboring conductors or separate coupling capacitance between the source and one or more neighboring conductors.

Electromagnetic (EM) characterization equations used in field solvers typically require significant compute time to solve the capacitance for a given set of geometric properties but are highly accurate. However, the computation time is often too burdensome to allow the field solver to be used to compute parasitic capacitance for significant regions of a conventional integrated circuit (IC) design.

One possible approach to address this problem is to generate field solver computed capacitance and resistance data for a limited number of test cases consisting of specific geometric descriptions of conductors. These test cases are then used to create an estimator of the capacitance and resistance, which is called an extractor or parasitic resistance and capacitance (RC) extraction component. However, the models in this approach are created with little or no knowledge of the specific types of design geometries the models will most likely encounter, and therefore analysis using these models is likely to produce sub-optimal results.

SUMMARY

Some embodiments of the invention provide an approach that uses a memory and learning component to improve capacitance and resistance estimates based on the types of layouts and devices being evaluated. According to some embodiments, a learning component is implemented that uses recommended test sets from the evaluation component to automatically test the extraction estimates against the field solver. Some embodiments may also use variability models from manufacturing or electrical analysis, such as timing computations, to select a series of objects (unique conductor geometries) that make up a conduction path or net or specific conductor geometries for evaluation and additional learning improvement.

Other additional objects, features, and advantages of the invention are described in the detailed description, figures, and claims.

BRIEF DESCRIPTION OF FIGURES

FIG. 1 illustrates an approach for utilizing a field solver.

FIGS. 2-4 illustrate approaches for generating an extractor model.

FIG. 5 illustrates an approach for using a histogram to select layout configurations.

FIGS. 7a-d, 8, 9a-b, and 10 illustrate example plots of capacitance data.

FIG. 14 illustrates a flow of an embodiment of the invention.

FIG. 15 illustrates an approach for using histograms in an evaluation component.

FIGS. 16a-b and 17a-b illustrate example plots of capacitance data.

DETAILED DESCRIPTION

Figure 6B:
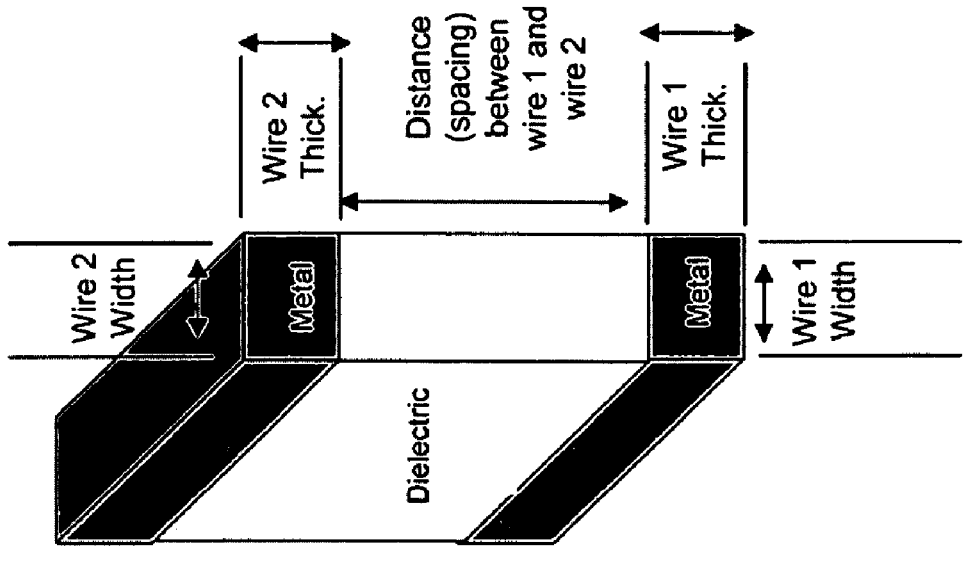
FIGS. 6a and 6b illustrate conductor configurations.

Some embodiments of the invention provide an approach that uses a memory and learning component to improve capacitance and resistance estimates based on the types of layouts and devices being evaluated. This approach uses a field solver to build an optimal initial memory of conductor geometry and parasitic resistance and capacitance pairs based upon the technology file description from the fabrication/manufacturing facility (fab) and specific test cases or available design layouts. An evaluation component is used that monitors the frequency of the conductor geometries being fed into the extractor. The evaluation component may also monitor the conditional variance of the capacitance and resistance values to identify the more nonlinear regions of the conductor geometry to parasitic capacitance and resistance relationships. Generally nonlinear regions will require either a larger memory component or additional training pairs to improve the estimation.

According to some embodiments, a learning component is implemented that uses recommended test sets from the evaluation component to automatically test the extraction estimates against the field solver. When the estimation errors defined by a cost function exceed a threshold, then the memory component in the extractor is modified to 'teach' it by modifying parameters to improve the estimate. The learning phase can be in parallel to normal extraction operations or done off-line when the extractor is not in use. As additional designs are evaluated by the extraction component the memory is modified and the extractor tailors its estimates to the types of designs, pattern dependent variation and manufacturing specifications provided by the fab.

Some embodiments may also use variability models from manufacturing or electrical analysis, such as timing computations, to select a series of objects (unique conductor geometries) that make up a conduction path or net or specific conductor geometries for evaluation and additional learning improvement. The primary advantage is that the parasitic extraction model accuracy improves as additional layouts or designs are encountered. The other advantage is that the learning or improvement can be shaped based upon frequency of conductor geometries, electrical criticality or sensitivity to pattern specific manufacturing variation.

As illustrated in FIG. 1, the field solver 84 receives the input data from a file or configuration data from another software component that reads the layout and creates a geometric description of each conductor event from either two or three dimensional scans 80. The field solver also imports a technology file description 82 of the material properties and film stack information specific to a particular fabrication process. The field solver computes the capacitances producing an output data file 86 that is either stored on a compute readable medium or is displayed to a user.

The output data 86 includes capacitance values that may include total capacitance of a single conductor, defined as the source conductor, relative to neighboring conductors or separate coupling capacitance between the source and one or more neighboring conductors, or the capacitance between the source and ground.

The problem is that a field solver is too slow to compute capacitances for a complete conventional IC chip design (often millimeters in both dimensions) in the time required for most design operations. Rather than explicitly solving the EM equations, the extractor is developed as an estimator of the field solver values and is created using data from the field solver. This process of creating the extractor models is described in FIG. 2.

The field solver data described in FIG. 1 is used to create the extraction model. The input data consists of geometric descriptions of conductor configurations 92 and a technology file description 93 of the material properties and film stack information specific to a particular fabrication process. The extraction model development software 94 also imports the capacitance data 91 produced by the field solver 90. This is the same data that is imported into the field solver in FIG. 1. The extraction model development software 94 receives the information and produces a model 95 for mapping conductor configurations 92 to parasitic capacitance 91 for this particular technology file 93.

Some alternative approaches for producing an extraction model are shown in FIGS. 3 and 4. FIG. 3 describes an approach that selects representative data points, conductor and capacitance pairs, that best describe the physical behavior characterized by the solver. The matrix containing the geometric description of conductors 120 is denoted by X. The technology file 122 is denoted by H. The field solver function or transformation $\phi$ that solves the parasitic capacitance matrix 124 (denoted by Y) corresponding to the description of conductors X. One embodiment uses a function approximation 130 to determine a set of data pairs that most effectively describes the mapping from X to Y as a function of H. In this embodiment, these methods use a cost function to evaluate a test set and select the optimal data pairs to retain in memory. The modeling algorithm will use this set of data in memory as a basis from which to estimate capacitance for a given query, which consists of the conductor configuration X and the technology file H. One approach for 130 is to use the full set (X,Y) or a subset $(\overline{X},\overline{Y})$ of the data to generate a least mean squares fit b. A separate test set $(\tilde{X},\tilde{Y})$ is generated and used to evaluate the beta parameters b. The evaluation of a given b is based upon the estimate $\hat{Y}$ of $\tilde{Y}$. As shown below, the function $f$ can be as simple as regression $\hat{Y}=\tilde{X}\cdot b$ or as complex as multilayer perceptron type architecture. The process iterates until an optimal set of G, denoted as G*, are found.

The optimal set may also include a set G based a weighted selection of values WX, where the elements of W are based upon nearness to some query point or a local neighborhood in the state space. To implement a weighted combination of data in X, substitute the matrix product $W\overline{X}$ for $\overline{X}$ in the equations below. In this approach, beta b can be computed using the weighted matrix products as well. The error can be defined by any cost function, for example least mean squares is the approach shown here but it can also be shown that for an unbiased estimator this also minimizes the conditional variance of the estimation error of Y given X. Other expressions for conditional variance $\sigma_{y|x}^2$ and Bayesian methods may also be used. The optimization can be done as least mean squares or gradient methods, such as Levenberg-Marquardt may be used to find the minimum. The optimal data set G* will form a memory component 132 that will be used to estimate capacitance $\hat{Y}$ given a new query $X_q$.

Another embodiment uses the same method to create extraction models for resistance where the mapping Y is the field solver computation of resistance, $\overline{Y}$ is a subset of resistance values from Y, $\tilde{Y}$ is the test set of resistance values, and $\hat{Y}$ is the estimate of resistance for a function and set of input variables. The resistance and capacitance models can be computed and used in parallel. The following are examples of equations that may be used:

$$Y = \varphi(X, H)$$

$$\overline{X} \subseteq X$$

$$\overline{Y} \subseteq Y$$

$$G = [\overline{X}\ \overline{Y}]$$

$$\overline{Y} = \overline{X} \cdot b$$

$$b = (\overline{X}^T \cdot \overline{X})^{-1} \cdot (\overline{X}^T \cdot \overline{Y})$$

$$\tilde{X} \subseteq X$$

$$\tilde{Y} \subseteq Y$$

$$\hat{Y} = f(\tilde{X}, H, G)$$

$$G^* = \min_G [(\tilde{Y} - \hat{Y})^T \cdot (\tilde{Y} - \hat{Y})]$$

$$\hat{Y} = f(X_q, H, G^*)$$

The other alternative shown in FIG. 4 is to find the beta parameters for $(\overline{X},\overline{Y})$ that minimize the estimate error over a test set 150 where the beta parameters are computed for a subset of X or a weighted transformation of X. The error can be defined by any cost function, for example least mean squares is the approach shown to minimize the estimate $\hat{Y}$ of $\tilde{Y}$. The optimal set of beta parameters b* are used to form a memory component 160 that will be used to estimate capacitance $\hat{Y}$ given a new query $X_q$. The optimal set may also use a set b based a weighted selection of conductor values WX, where the elements of W are based upon nearness to some query point. The error can be defined by any cost function, for example least mean squares is the approach shown here but we can also show that for an unbiased estimator this also minimizes the conditional variance $\sigma_{y|x}^2$ of the estimation error of Y given X. Other expressions for conditional variance $\sigma_{y|x}^2$ and Bayesian methods may also be used. The optimization can be done as least mean squares or gradient methods, such as Levenberg-Marquardt may be used to find the minimum. The fitting parameters b may also be found through minimizing the negative log likelihood of b given $(\overline{X},\overline{Y})$ and this approach can be extended to any function approximation method that uses basis functions, e.g. a sigmoid, gaussian, by minimizing the estimated variance of the estimator.

Another embodiment uses the same method to create extraction models for resistance where the mapping 144 Y is the field solver computation of resistance, $\overline{Y}$ is a subset of resistance values from Y, $\tilde{Y}$ is the test set of resistance values, and $\hat{Y}$ is the estimate of resistance for a function and set of input variables. The resistance and capacitance models can be computed and used in parallel. The technology file 42 is denoted by H. The following are examples of equations that may be used:

$$Y = \varphi(X, H)$$
$$\overline{X} \subseteq X$$
$$\overline{Y} \subseteq Y$$
$$G = [\overline{X} \quad \overline{Y}]$$
$$\overline{Y} = \overline{X} \cdot b$$
$$b = (\overline{X}^T \cdot \overline{X})^{-1} \cdot (\overline{X}^T \cdot \overline{Y})$$
$$\tilde{X} \subseteq X$$
$$\tilde{Y} \subseteq Y$$
$$\hat{Y} = f(\tilde{X}, H, \overline{X}, b)$$
$$b^* = \min_b [(\tilde{Y} - \hat{Y})^T \cdot (\tilde{Y} - \hat{Y})]$$
$$\hat{Y} = f(X_q, H, \overline{X}, b^*)$$

The conductor configurations forming $(\overline{X}, \overline{Y})$ may be chosen randomly, possibly from an existing layout. A more strategic approach may select configurations to best characterize the range of potential conductors encountered in a real design. One approach selects conductor configurations 140 that are chosen to span the range of potential configurations that the extractor may experience.

This data may be selected based on the known range of conductor width and spacing as defined by rules followed by the designer. Given the potential variation that occurs during manufacturing, some margin may be added to the range of geometric parameters to ensure extreme values fabricated beyond the intended design are included. This data may also be selected based on the most frequent configurations identified in one or more design layouts. For example, configurations with minimum width wires at the minimum spacing rules may dominate the first, second or third metal levels and may represent 40% of the configurations found on those levels.

As shown in FIG. 5, a histogram 168 could be useful for illustrating the frequency that each configuration appears in the layout. A software algorithm could be used to select configurations from that histogram to populate the set of data used to develop the extractor. A third option is to use Monte Carlo sampling of the allowable conductor configuration states that are governed by design rules and manufacturability variation. The design layout is used by an evaluation component to determine the set of configuration and capacitance and resistance pairs for testing. The new configuration(s) that are to be solved are sent to the field solver for processing, and the resultant data for training is sent to an extractor.

Figure 6A:
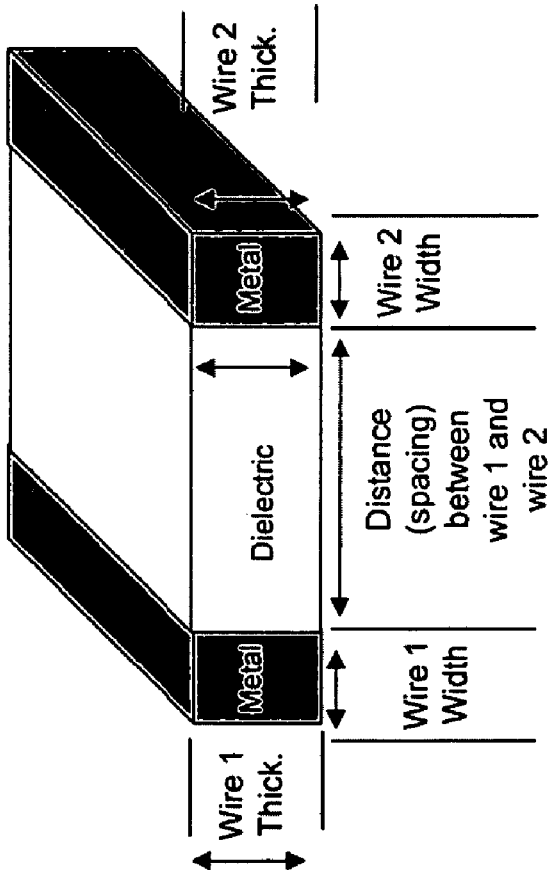

The conductor configurations are a description of the geometric shapes of the metal material that conducts current and the insulating material that separates one conductor from another. FIG. 6a illustrates a geometrical description of two conductors in the same metal level where the width and thickness of one metal conductor, e.g. an interconnect wire, and another are separated by an insulating dielectric with a thickness and width. The width of the dielectric between two conductors is often referred to as the spacing between conductors. The material between two conductors may be a dielectric material or even air as in the case of air gap technology. FIG. 6b illustrates the same concept where one conductor is above the other, separated into two different interconnect levels. The nominal thickness of the conductor and insulator materials may be included in the technology file that is provided by a fabrication facility or fab. Variations in the widths and thicknesses of the conductors and insulators due to manufacturability effects, such as pattern dependencies with lithography, etch and CMP may also be used to define a conductor configuration.

The input and output data are provided to a software component to capture the mapping of the input to the output data. This mapping may be a mathematical approximation of the EM equations to achieve this mapping in a more computationally efficient manner. This mapping may be generated using function approximation methods such as linear regression, principal component regression, partial least squares or machine learning algorithms.

In one embodiment, the mapping uses knowledge of the EM physics to transform the conductor configuration input data to a different mathematical basis. Consider the univariate example shown in FIG. 6 where metal wire 1 is defined as the source. The objective is to estimate the coupling capacitance between metal wires 1 and 2. According to some configurations, if the coupling capacitance is plotted versus the distance between the two conductors, the relationship would roughly follow the trend shown in FIG. 7a with the data normalized to fit the two axes. If the same data is plotted as the coupling capacitance between metal wires 1 and 2 versus one of the distance between them the trend would roughly follow that shown in FIG. 7b. For many function approximation methods, the relationship in FIG. 7b is easier to fit given the fewest data points and is particularly the case for any linear or semi-linear regression methods. For example, a least squares fit of the data shown in FIG. 7a is shown in FIG. 7c, where the fit 221 using the parameters b doesn't match well with the original trend 220. The least squares fit in FIG. 7d falls right on top of the original and can be described with two sample x,y pairs.

This approach can be extended to the multivariate case by transforming the input parameter vectors to effectively linearizes the parametric relationship between the input and output vectors. As such, linear approximation methods may be employed with more success and require less solver data representations to describe the relationship. The mapping may have two stages where the first stage transforms the geometric input description to a new basis space and the second stage is where the transformed data is fit to the output data, producing a second transformation that estimates the output capacitance data. In another embodiment, the input parameters could be polynomial in nature with higher order terms that effectively linearize the input space prior to regression.

In another embodiment, linearization of the input space may be aided by the use of data partitioning schemes where the regions of the conductor state space stored in memory are divided into regions that are fit separately as another way of linearizing the state space. The partitions may be 'hard' where each data pair can only belong to one region of the state space or 'soft' where the data is weighted depending on how close it may be to a particular data pair within the region or the border of a particular region. An example of this is shown in FIG. 8 where given the relationship plotted in FIG. 8 and only three samples can be used to describe the data. FIG. 9a shows a possible linear fit 244 of the three data points 241, 242, 243 selected along the curve 240. FIG. 9b shows using a hard partition 255 to separate two sets of x,y data 252, 254 (segment 258) and 254,256 (segment 260) for the curve 250. The separate linear fits 232 and 234 for each are shown in FIG. 10. In this simple example, the use of soft or hard partitioning allows for a piece-wise approximation to be employed.

As shown in the examples in FIGS. 6-10, estimates can be acquired by having either x,y data sampled from a given function or the beta parameters resulting from fitting. In one embodiment the data pairs or their beta counterparts may be stored in computer memory and used to estimate capacitance for a given query. The estimation algorithm may use all (X,Y) or a subset of pairs ($\overline{X},\overline{Y}$) in memory. The estimation algorithm may use the known and provided geometric description provided as part of the query input vector to select which pairs of data to use with function approximation methods. The estimation algorithm may even weight certain data in memory based on how similar the query point is to the data stored in memory.

Figures 11, 12:
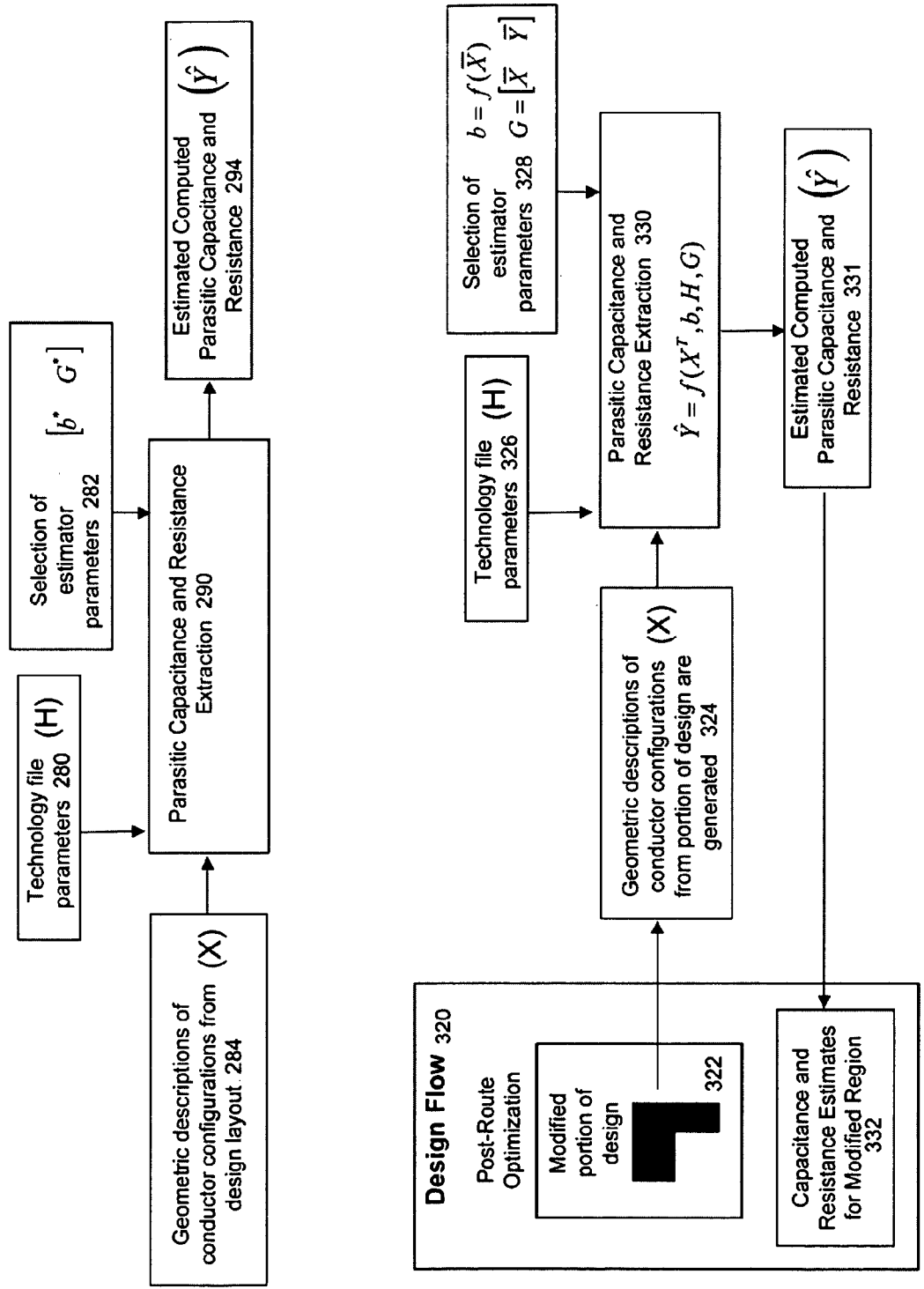
FIG. 11 illustrates the operation of an extraction component.
FIGS. 12 and 13 illustrate example use cases.

FIG. 11 illustrates the operation of the extraction component. Where an embodiment described above is used to generate the estimator parameters b* or G* 282, the parasitic extraction component 290 can accept a geometric description of conductor configurations 284 and a technology file description 280 and estimate the parasitic capacitance 294 for the configuration.

Figure 13:
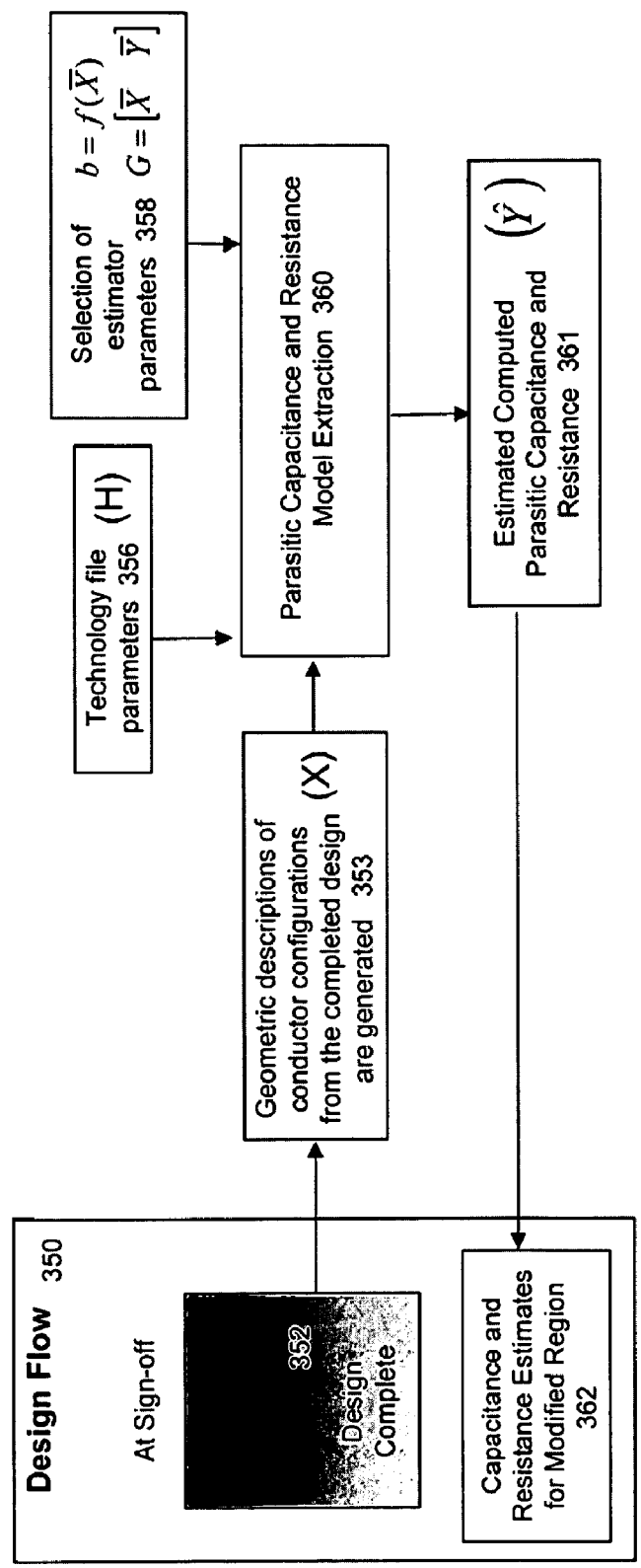

Two use cases are described in FIGS. 12 and 13. In FIG. 12, a modified portion 322 of a design within the design flow 320, for example a re-routed group of interconnect wires, is passed to an extraction component that transforms the layout resident objects into a series of geometric descriptions 324, denoted as X, that are input into the extraction models for an extraction component that use estimator parameters 328 and technology file data 326 to estimate the parasitic capacitance 330 for the series 331 which are returned as estimate 332 for analysis with the design flow 320. This use case is referred to as incremental extraction where a portion of a given layout has the resulting capacitance values estimated as modifications are made. This use case may also use a scan line approach where a scan is made over the section of layout detecting different configurations, called events, and transforming each into the proper geometric description.

In FIG. 13, sign-off for the design flow means that the full design 352 is completed and the extraction component reduces the full layout into a series of conductor geometries 353 that are fed into the models for which parasitic capacitance and resistance mode extraction are performed 360 using technology file parameters and estimator parameters 358, and from which parasitic capacitance is estimated 361. These results are passed as estimates 362 for the modified regions back to the design flow 350. This use case may also use a scan line approach where a scan is made over the full layout detecting different configurations and transforming each into the proper geometric description.

FIG. 14 shows the complete flow from the initial formation of the initial estimator memory core component to the operation with the design flow according to an embodiment of the invention. In this flow, there is both an off-line learning phase 1510 and a real-time phase 1520. As the design is created, modified or verified, calls are made to the extraction component to translate the geometric descriptions of the shapes contained in the layout to parasitic capacitance estimates. This may be done with section of layout in incremental mode or for a full layout as part of verification and signoff. As design data is provided to the extractor, an evaluation component may be used to monitor statistics on the more frequent configurations in one or more designs.

As shown in FIG. 15, a histogram 1530 may be formed to determine and select the most common configurations for testing. In the example shown in FIG. 15, the 0.14 and 0.28 micron wire widths are the most common and thus a test set if formed where the distribution of configurations with those wire widths are more likely. The selection of the parameters may be explicitly determined conductor configurations from the histogram or stochastic sampling where a selection is determined according the underlying distributions found in one or more layouts. In this example, configurations would be selected with a higher conditional probability given conductor widths of 0.14 and 0.28 micron.

Another embodiment may evaluate the underlying mapping of conductor configurations to parasitic capacitance to determine the best pairs for testing the extraction. It is commonly accepted that the more nonlinear relationships are generally more difficult to fit and require more data particularly where the function is more nonlinear. One method of determining the more nonlinear regions is to compute a partial derivative of the output capacitance as a function of an input parameter. The capacitance and lateral spacing relationship is plotted in FIG. 16a and the partial derivative of output versus input is plotted in FIG. 16b. Using the gradient information, a method could select the data pairs 722 in FIG. 16a to test the more nonlinear regions.

Another example is shown in FIG. 17, where the underlying function is shown in FIG. 7a and the partial derivative is shown in FIG. 17b. Again a sampling algorithm that uses the gradient information is indicated with the highlighted points 726 on the original function in 17a. As alternative the conditional variance $\sigma_{y|x}^2$ of the capacitance values y with respect to geometric description x could similarly be used to find the areas where y varies significantly with x as follows:

$$\sigma_{y|x}^2 = \sigma_y^2 - \frac{\sigma_{xy}}{\sigma_x^2}$$
$$= \sum_{\forall x,y} (y - E(y|x))^2 \cdot P_{y|x}(y|x)$$

Figure 18A:
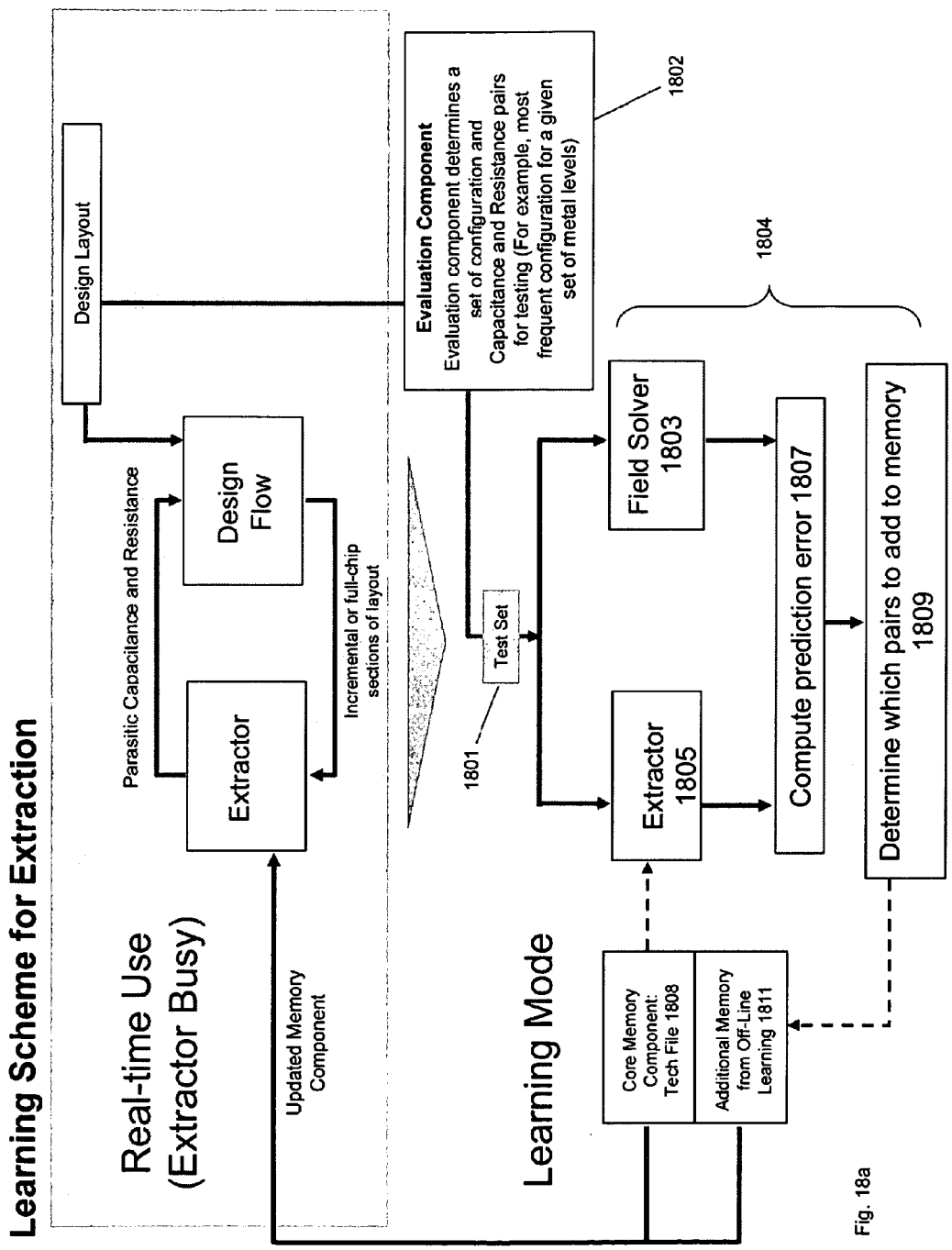
FIGS. 18a-b and 19 illustrates flows of embodiments of the invention.

As shown in FIG. 18a, the evaluation component 1802 generates a test set of x,y data that is used to evaluate regions where the extraction models may be improved. In the learning phase 1804, this test set 1801 is provided to both the field solver 1803 and extraction models 1805 where a physical location is received and the layout is converted to a geometric description or the geometric description is provided directly by the evaluation component. In this approach, the field solver is used to train or teach the extractor to improve its estimates of the field solver values. The geometric description is used either in raw form or transformed into a more effective basis to generate both a field solver and extraction model based parasitic capacitance estimate.

A cost function is used to evaluate the prediction error 1807. For example, the cost function could compare the maximum absolute error or the maximum percentage, i.e. estimation error divided by the field solver value. The cost function will compare the 'cost' against a threshold and determine the optimal data pairs G* or beta parameters b* to add to the additional memory component 1809. The core memory 1808 can be maintained separately from the additional memory for the off-line learning 1811 so as to allow the user to go back to the original state at any point. Once the memory component is modified sufficiently, the new memory component or components are then used for real-time extraction computation.

Figure 18B:
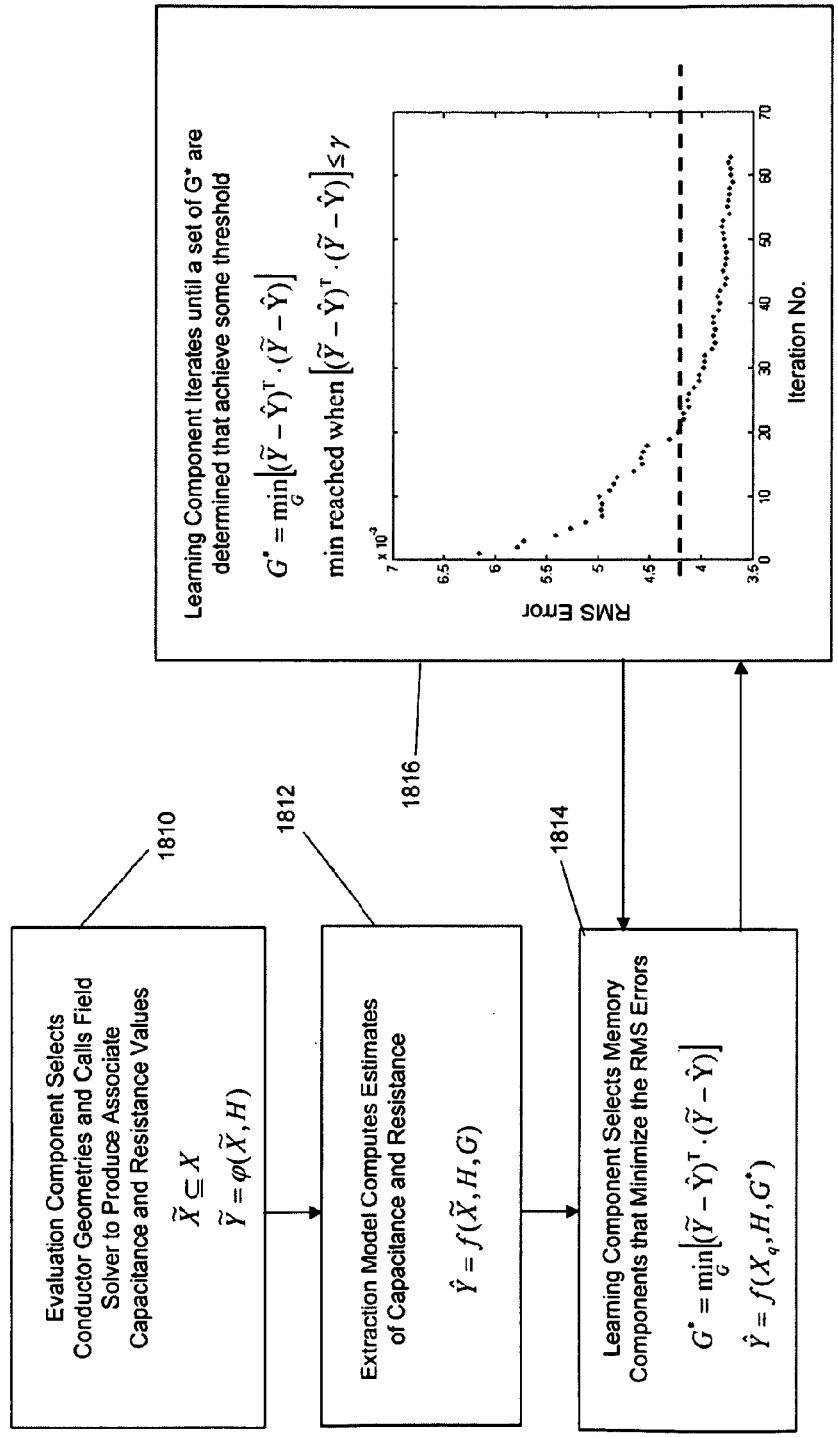

One embodiment of the learning component is described in FIG. 18*b* where the evaluation component selects a test set of conductor geometries $\tilde{X}$ for a technology file H and calls the field solver to compute the associated capacitance and resistance values $\hat{Y}$ (1810):

$$\tilde{X} \subseteq X$$

$$\tilde{Y} = \phi(\tilde{X}, H)$$

The extraction model uses a memory component G or alternatively X and b to estimate the capacitance and resistance values $\hat{Y}$ (1812). The learning component selects memory components that minimize the rms error (1814). For those value of $\tilde{X}$ and $\tilde{Y}$ where the rms errors exceed some threshold γ, the learning component iterates until an optimal set of G or b parameters are determined that minimize the rms error relative to the threshold (1816). In some cases, a conductor geometry and capacitance and resistance pair in the test set is added to G and meets the error threshold. As such, the pair may be directly added to the memory component that is used with regression methods to compute $\hat{Y}$:

$$G^* = \min_{G} \left[ \left( \tilde{Y} - \hat{Y} \right)^T \cdot \left( \tilde{Y} - \hat{Y} \right) \right]$$

$$\text{min reached when } \left[ \left( \tilde{Y} - \hat{Y} \right)^T \cdot \left( \tilde{Y} - \hat{Y} \right) \right] \leq \gamma$$

Figure 19:
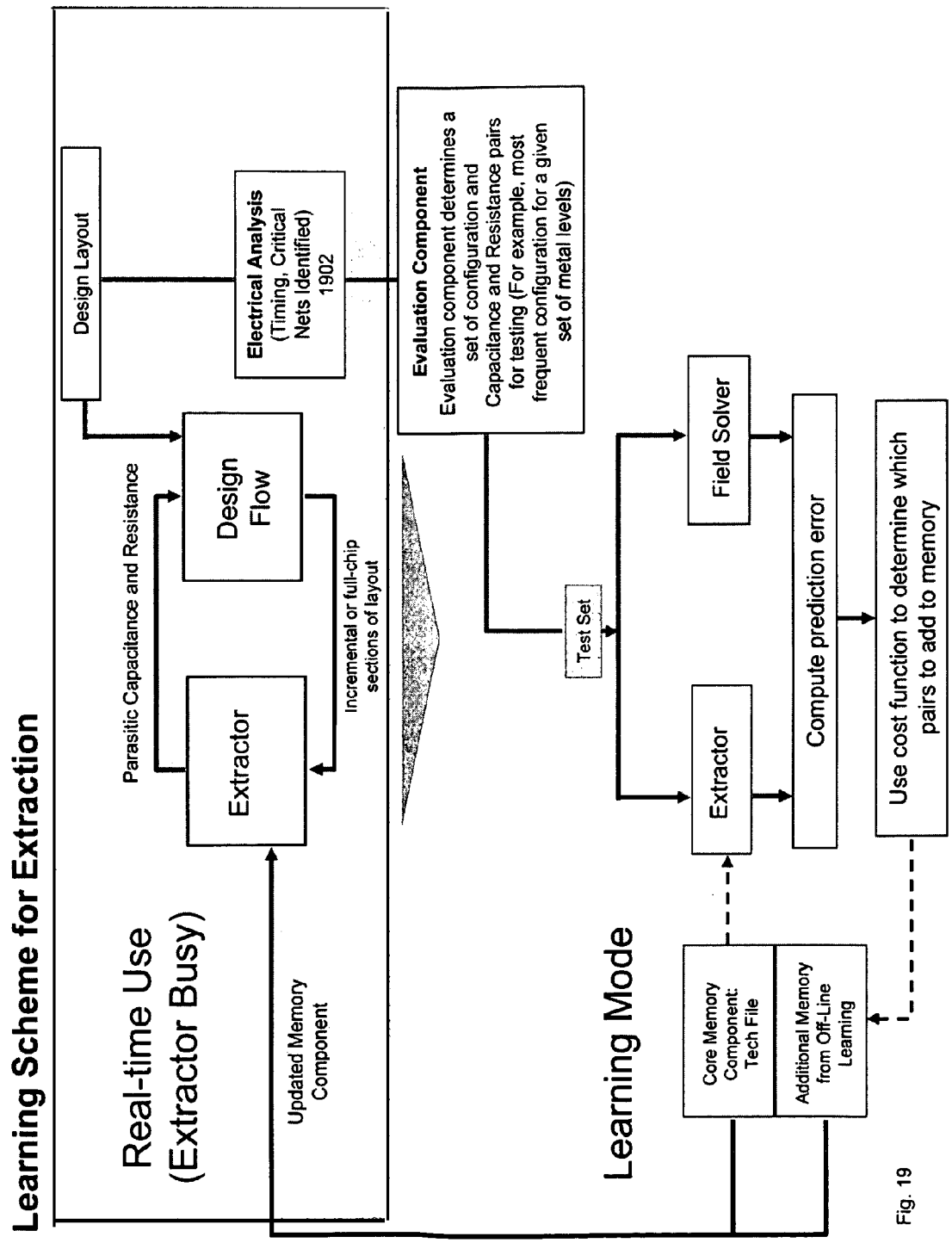

Another embodiment is shown in FIG. 19 where electrical analysis 1902 is used as part of the evaluation. Electrical analysis such as critical net identification may be used to select a set of configurations found along the critical net for further evaluation and improvement. This embodiment is very similar to the prior example in FIG. 18 but the evaluation component uses some element of electrical analysis to select the testing pairs. This approach allows the extractor to learn to be more accurate on those regions of the design that are most critical to the performance of the chip.

Another embodiment uses manufacturing models to estimate variability and sensitivity of the layout to the fabrication process. The physical representation of an integrated circuit design comprises a series of shapes or objects and the physical locations of those shapes. There is often a mismatch between the geometries of the shapes in the design and what is manufacturing in a fabrication facility.

Figure 20:
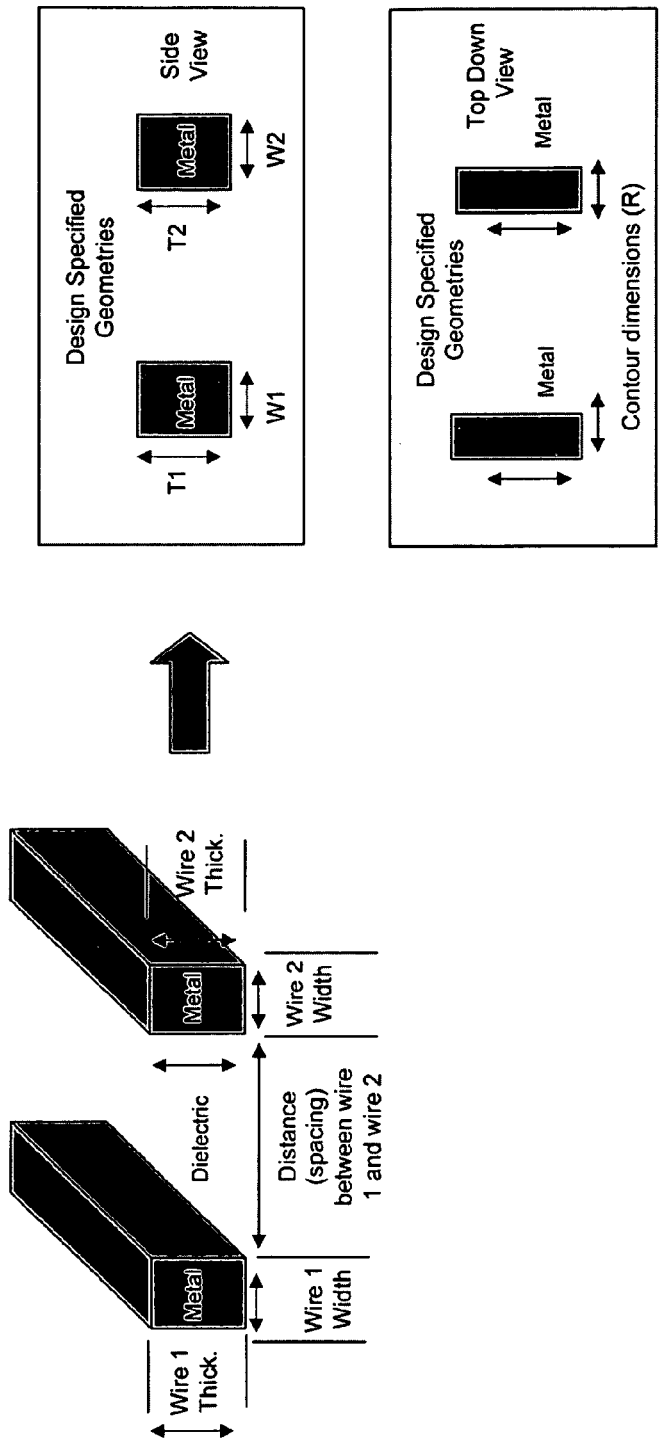
FIG. 20 illustrates example wires.
Figures 21A, 21B:
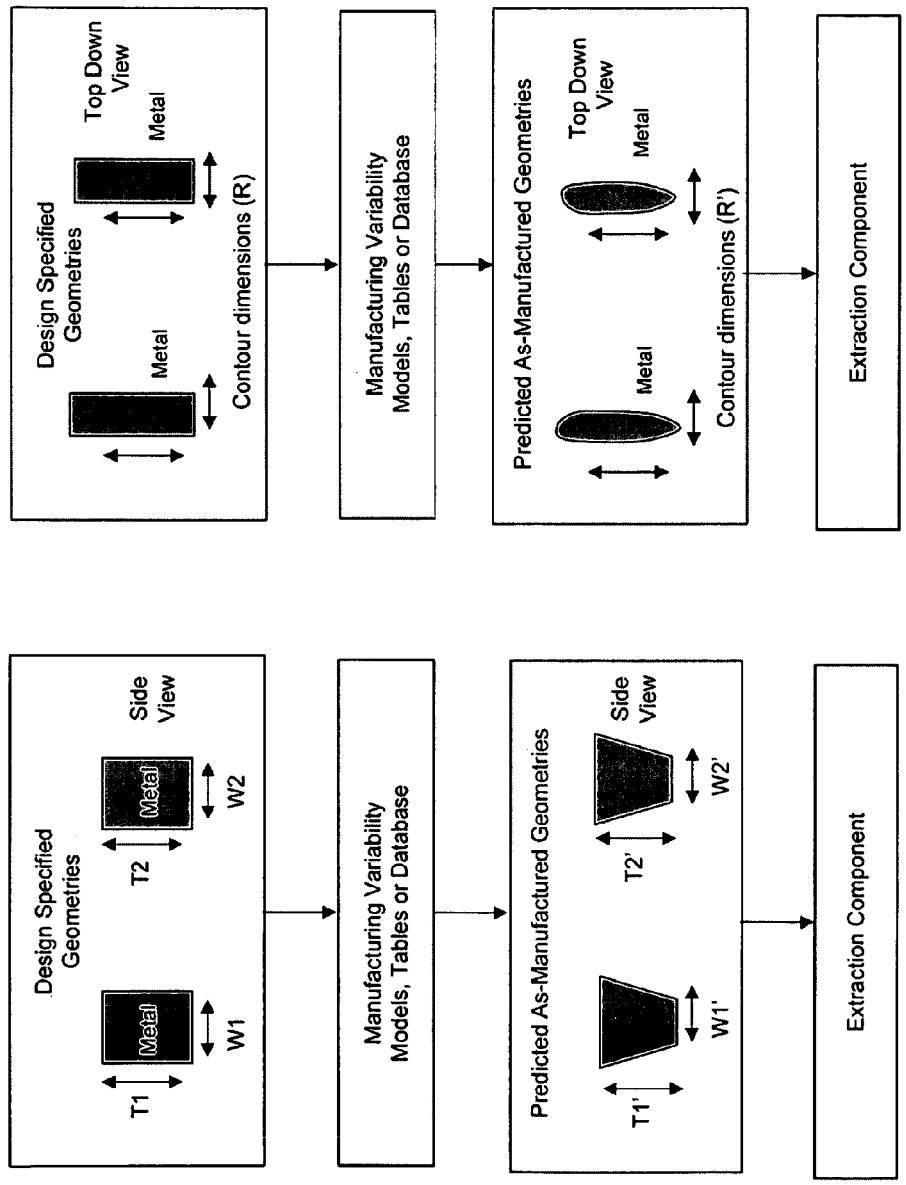
FIGS. 21a-b illustrate variation aware learning.

FIG. 20 illustrates two example wires from a cross-sectional view and a top down view with specified thicknesses and widths. Typically the thickness values are defined as a nominal thickness specified by the film stack information in the technology file provided by the fab. The width values are typically specified by a chip designer or an automated layout tool that specifies a particular dimension or contour. Manufacturing processes such as lithography, etch, chemical mechanical polishing, and deposition produce the actual shapes that constitute a device. The variation that these processes impart to the specified shapes can result from process and pattern interactions where the same shape, for example a conductor with a specific width and thickness, can exhibit different variation depending upon the neighborhood of shapes or patterns around that shape. Pattern dependent models have been created that model the manufacturing behavior of transforming the design geometries to the as-manufactured geometries or shapes. This is illustrated in FIG. 21*a* where the thickness variation induced by pattern interactions with chemical mechanical polishing and etch are shown where the resulting trapezoidal shape has a different width and thickness. FIG. 21*b* illustrates the transformation of the design geometries to the as-manufactured shapes using models of the lithography and etch processes.

Figure 22:
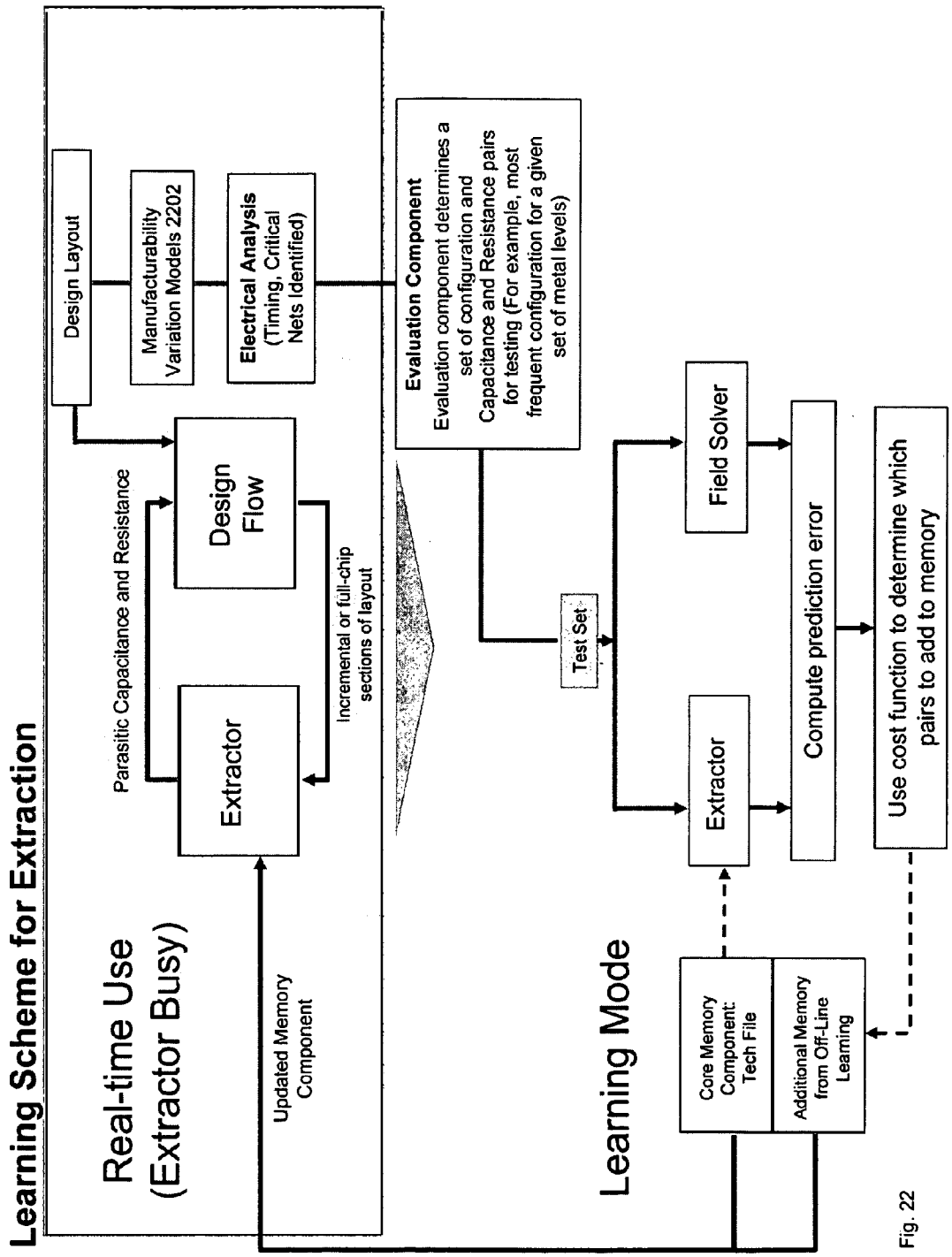
FIGS. 22 and 23 illustrate flows of embodiments of the invention.

In this approach, described in FIG. 22, models 2202 are used to predict the width and thickness variation that results from pattern specific interactions that results during manufacturing. Any type of models may be used, including models of one or more of the following: chemical mechanical polishing (CMP), lithography, etch process, deposition and doping implantation. These models convert the layout shapes to a geometric description, e.g. contours, densities, thickness, widths, and based on the shapes and neighboring shapes within a neighborhood can predict the resulting pattern or layout dependent variation. This physical variation can be used independently or (as shown in FIG. 19) with extraction and electrical analysis to determine critical nets or variation sensitive regions or nets within a design. The results are used to generate a test set for evaluating the extraction models against the field solver in the learning phase. The result is an extraction model that improves its estimation of capacitance as a function of criticality and manufacturing variation.

Figure 23:
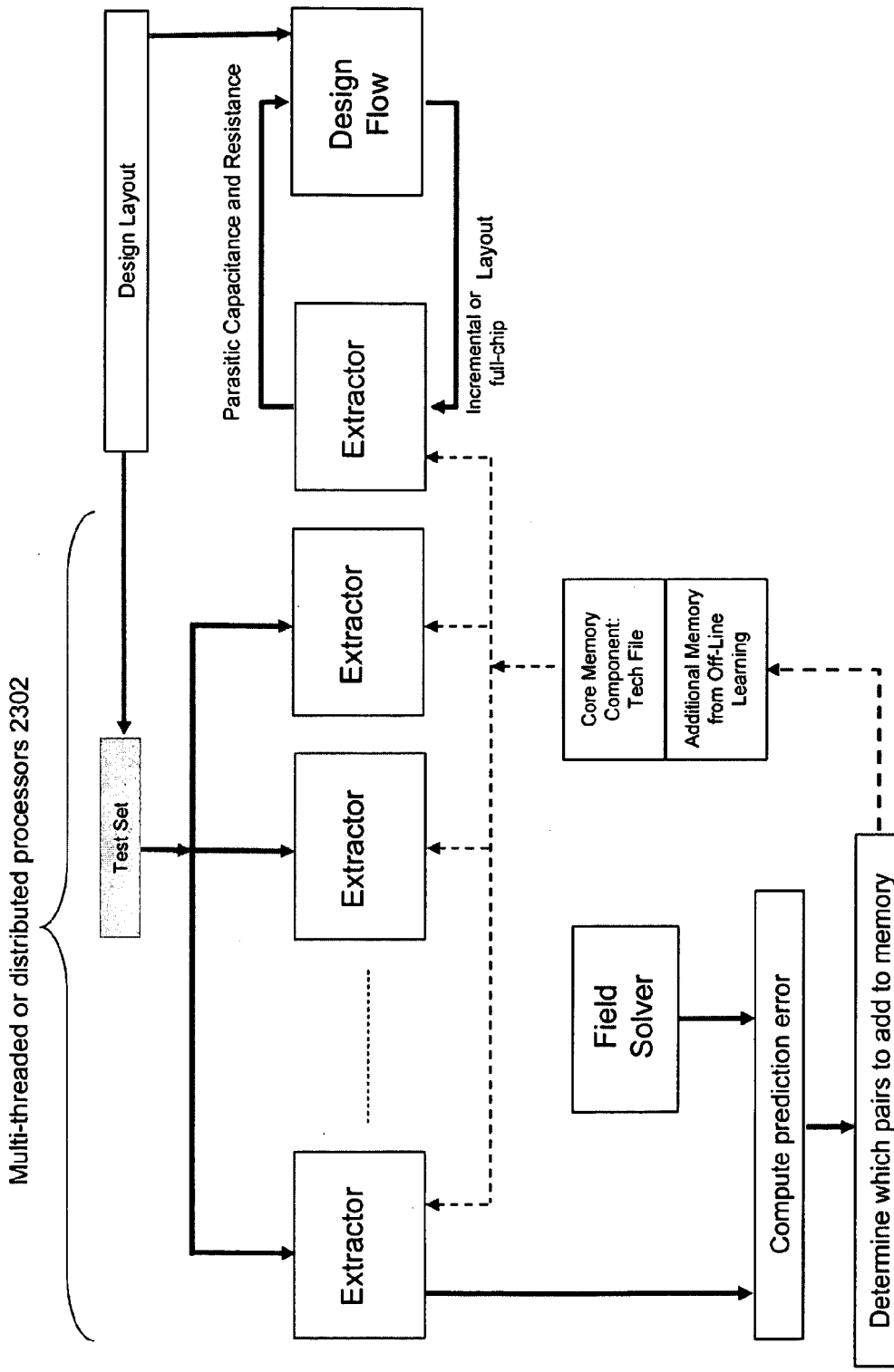

As shown in FIG. 23, the learning mode may occur on separate microprocessors 2302 in a distributed or multi-threaded manner, and in parallel with normal extraction operation.

Figure 24:
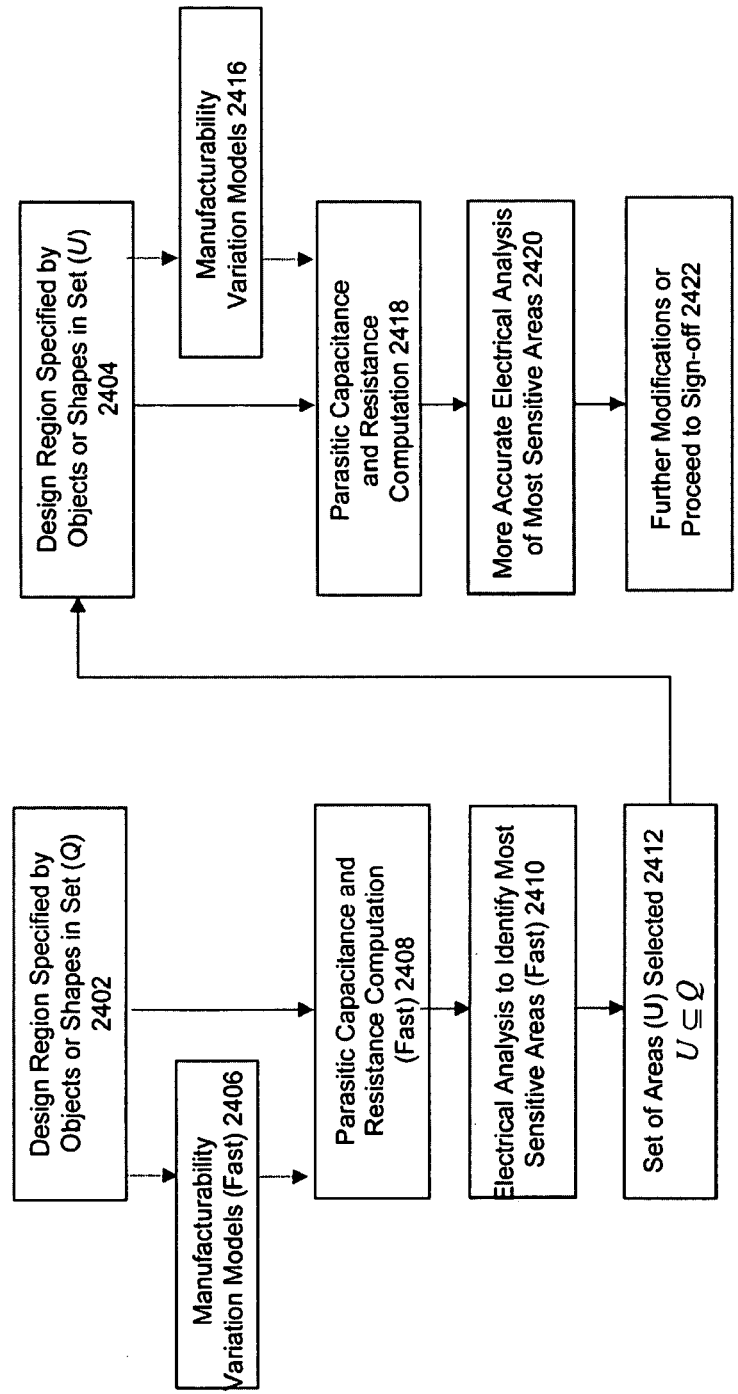
FIG. 24 illustrates a focusing mechanism.

Another embodiment uses a two phase approach to more efficiently find areas of a particular layout that require more accurate prediction or learning. FIG. 24 illustrates a focusing method where some section of a design (or the complete design) is defined as a set of shapes or objects Q. The region 2402 is provided to a set of parasitic capacitance or resistance models that are created to perform a faster computation 2408, perhaps trading accuracy for speed. Alternatively, the region may also be used with fast models or tables of manufacturing variability data 2406 to modify the geometries, e.g., as described in FIGS. 21*a* and 21*b*. The model based estimates of capacitance and resistance are provided to the electrical analysis component 2410 that is similarly created to produce fast analysis, such as fast timing computation. Based on the results of the electrical analysis, a subset of areas U are selected 2412 and forwarded to a set of more accurate parasitic capacitance and resistance models. Alternatively, given a smaller region 2404 of the design to evaluate, the manufacturing variability models 2416 can be created to provide more accurate geometric variations to the intended geometric shapes or objects. The resulting parasitic capacitance is input into an electrical analysis component that produces more accurate analysis (2418, 2420). Since U represents a smaller region of the design, a more accurate delay calculator may be used to produce a more accurate timing assessment. The results can be used to make specific modifications to the design, for example resizing or moving a wire or array of wires, or if the analysis meets some defined criteria the flow proceeds to sign-off activities (2422).

Figure 25:
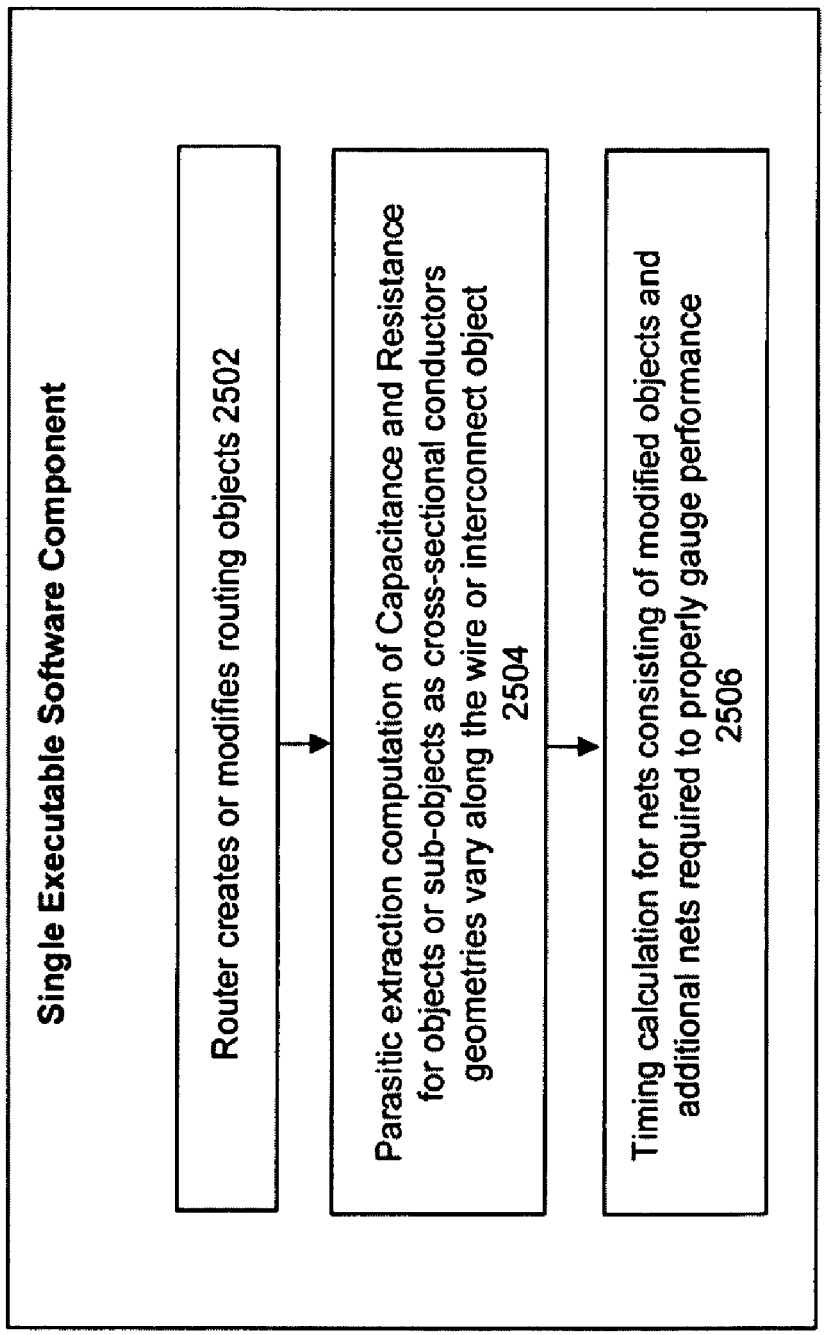
FIG. 25 illustrates an executable software component.

FIG. 25 illustrates a flowchart of an embodiment of an approach for implementing a single executable software component. At 2502, the router component creates or modifies one or more routing objects. At 2504, parasitic extraction is performed to compute capacitance and resistance for objects or sub-objects as cross-sectional conductor geometries vary along a wire or other interconnect object. Timing calculations are determined at 2506 for nets that include modified objects and additional nets that are needed to gauge performance.

Figure 26:
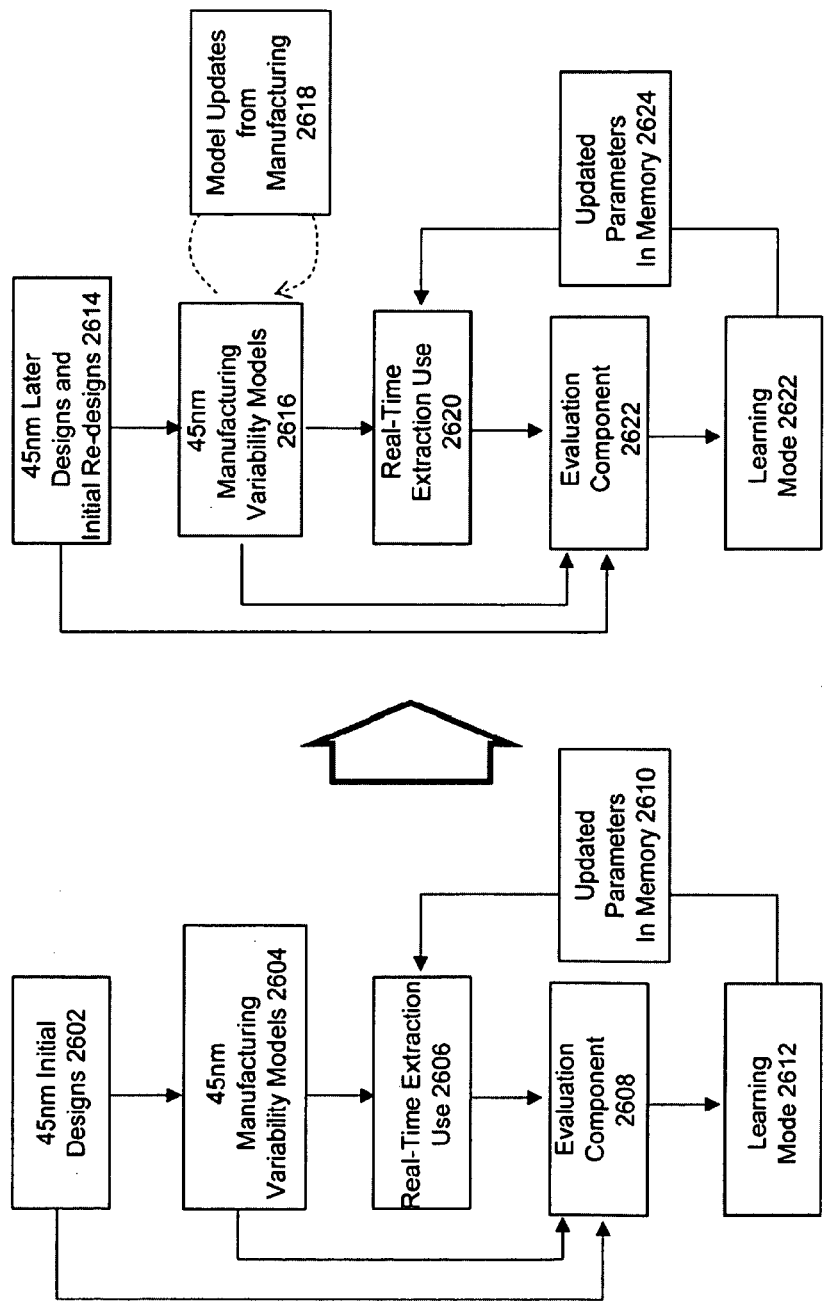
FIGS. 26-28 illustrate example use cases.

FIG. 26 illustrates an example use case for some embodiments of the invention. In this example, an initial 45 nm design 2602 is created which is used as input data for an evaluation component 2608. Models 2604 for 45 nm manufacturing variability are used to perform real-time extraction 2606. The evaluation component 2608 generates data and configurations to be solved for the 45 nm designs for the learning mode 2612. This is used to update parameters 2610 in memory.

During real-time usage, the later 45 nm designs along with the initial 45 nm design 2614 are sent to the evaluation component 2622 for analysis. 45 nm manufacturing variability models 2616 are used for real-time extraction 2620, where model updates 2618 are provided from manufacturing. This update to the models allows significantly improved analysis results based upon more accurate models. The evaluation component 2622 generates analysis data which is used again for the learning mode 2622 and used to update parameters 2624 in memory.

Figure 27:
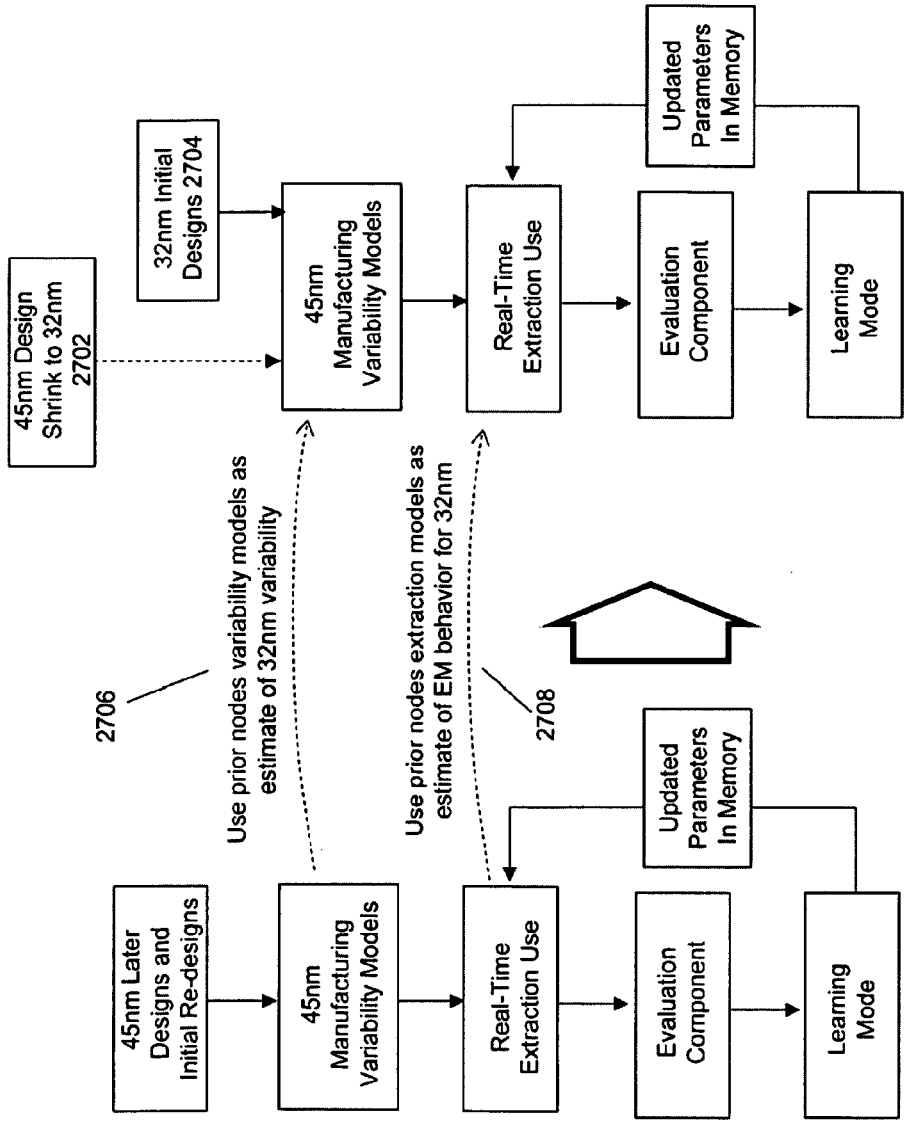

FIG. 27 illustrates a version of the use example of FIG. 26 in which the 45 nm IC design shrinks to a 32 nm design 2702. In this situation, the 32 nm initial IC design can be used with the 45 nm manufacturing model, where the prior node variability models 2706 are used as an estimate of 32 nm variability. Similarly, the prior node extraction models 2708 can be used an estimate of EM behavior for the 32 nm design.

Figure 28:
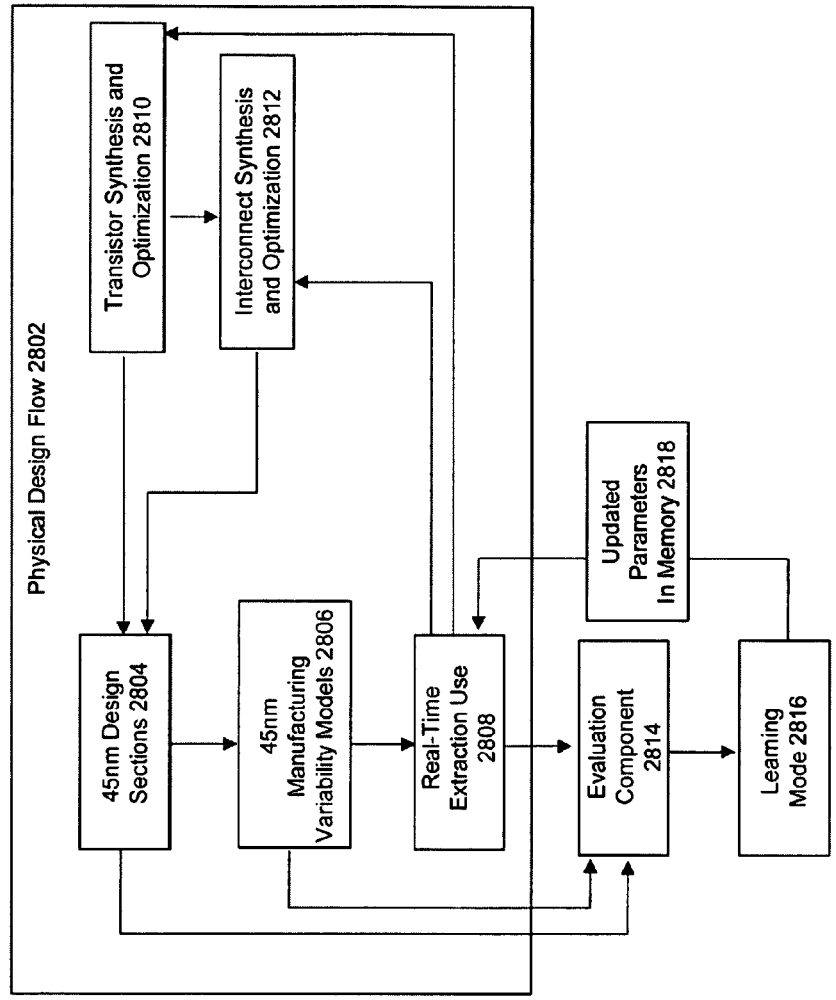

FIG. 28 illustrates yet another example use case for IC design activities according to some embodiments of the invention. In the physical design flow 2802, 45 nm design sections 2804 are provided to the 45 nm manufacturing variability models 2806 for real-time extraction 2808. The output of the extraction action is used for interconnect synthesis and optimization 2812, e.g., to implement or modify interconnect objects in the 45 nm design based upon electrical analysis of the circuit design and expected manufacturing results. In addition, transistor synthesis and optimization 2810 can also be performed based upon the results of the real-time extraction 2808. For the learning mode 2816, the output of the real-time extraction is used by the evaluation component 2814 to determine if any of the models or data should be modified, e.g., based upon histogram analysis. If so, then updated parameters 2818 are placed into memory and used by the real-time extraction 2808.

Therefore, what has been described is an improved approach for performing electrical analysis. Some embodiments provide this improved performance by formation of a memory comprising conductor configuration and capacitance pairs, where state space exploration is used to select conductor and capacitance data to add to memory. Selection and use of local sections of memory are based on the conductor configuration to estimate capacitance for a given query.

According to some embodiments, parameterization of conductor configuration is based on the physics and use of learning to adapt the parameterization to minimize a cost function. Device specific layout statistics (e.g. graphics processor, mixed-signal, etc.) are used to generate specialized memories with more representative configurations based on frequency of occurrence. Learning component are employed that use the distribution of configurations for a given layout or layout type to call a solver, generate a test set, compute test set values using the extractor, monitor the errors, and locally update the memory.

A distribution (histogram-frequency, range as function of conductor geometry) is formed for layout configurations and for selecting configurations to test and update the memory component. Hard partitions may be used to separate regions in the memory where a given query point only uses configuration and capacitance pairs within a defined segment to estimate capacitance for the query point.

Timing calculations may be used to identify problematic paths and create configuration samples for the solver to test the extractor and initiate learning to locally reconfigure memory. Conditional variance of capacitance may be computed with respect to configuration geometric properties to identify more nonlinear regions of the state space and create configuration samples for the solver to test the extractor and initiate learning to locally reconfigure memory. A gradient of capacitance change with respect to conductor configuration geometry may also be computed, for example the choice of locally distant configuration and capacitance pairs in memory, to identify more nonlinear regions of the state space and create configuration samples for the solver to test the extractor and initiate learning to locally reconfigure memory.

Figure 29:
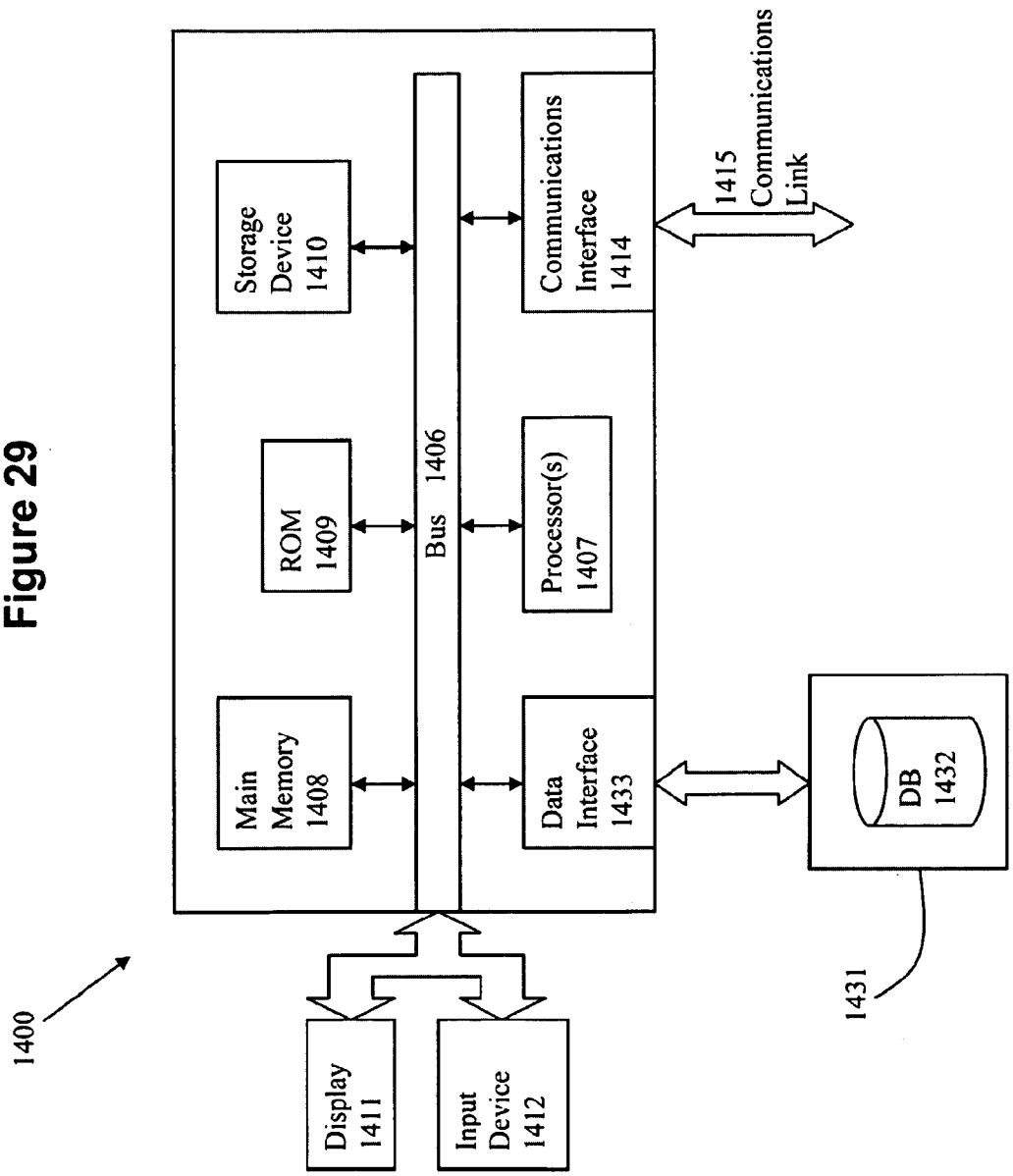
FIG. 29 shows an architecture of an example computing system with which the invention may be implemented.

A kernel function may be used to select and weight a locality of memory elements (configuration and capacitance pairs) for use in estimating capacitance for a given query point. Memory elements may be used to produce a estimation vector transforming conductor geometries to capacitance for a given query input. An estimator vector may be used as a sensitivity function to produce a distribution of capacitance values as a function of estimated or measured variability in the geometric inputs. A faster extraction model and electrical analysis may be used to determine a subset of layout objects or nets on which a more detailed parasitic capacitance and resistance extraction and analysis is performed. In addition, routing of interconnect, parasitic capacitance and resistance extraction computation and a timing calculation can be performed in a single executable software component System Architecture Overview FIG. 29 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH- EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer program product that includes a non-transitory computer readable medium, the non-transitory computer readable medium comprising a plurality of computer instructions which, when executed by a processor, cause the processor to execute a process for performing real-time electrical analysis of an electronic design, the process comprising:
   receiving design information for the electronic design;
   performing electrical analysis for one or more objects within the electronic design based at least in part on a description of conductor configurations and a mathematical model;
   selecting one or more conductor configurations, shapes or patterns;
   performing a learning mode to improve estimates made by an extraction component, which estimates a parasitic characteristic of at least some of the one or more conductor configurations, shapes or patterns that are identified based at least in part upon results of performing the electrical analysis; and
   generating a modified mathematical model based at least in part upon the results of the learning mode.

2. The computer program product of claim 1 further comprising using a field solver, which analytically solves the electronic design, to adjust or modify the mathematical model.

3. The computer program product of claim 2 in which test data for the field solver is identified based upon distribution of the one or more conductor configurations within the electrical design.

4. The computer program product of claim 3 in which a frequency of the one or more configurations within the electrical design is identified using a histogram or range of the one or more conductor configurations.

5. The computer program product of claim 1 in which the model is modified by adding a conductor configuration and capacitance pairs to local memory.

6. The computer program product of claim 1 in which timing calculation is performed using the modified model.

7. The computer program product of claim 1 in which statistical analysis of computed capacitance and resistance are used with a field solver, which analytically solves the electronic design, to test an extractor and initiate the learning mode.

8. The computer program product of claim 1 in which an estimator vector is used as a sensitivity function to produce a distribution of capacitance values as a function of estimated or measured variability.

9. The computer program product of claim 1, in which a technology file description from an integrated circuit fabrication facility is used for the electrical analysis.

10. The computer program product of claim 1 wherein the one or more conductor configurations comprises shape related information for a neighborhood of conductors around an object for which resistance and capacitance is computed.

11. The computer program product of claim 1 wherein selecting the one or more conductor configurations, shapes or patterns is based at least in part on analysis of electronic design data related to the frequency of configurations, shapes or patterns within one or more interconnect layers or one or more electronic designs or at least in part on analysis of electronic design data related to electrical analysis model estimation errors for the configurations, shapes or patterns within one or more interconnect layers or one or more electronic designs.

12. The computer program product of claim 1 wherein the model is created using a description of conductor configurations related to one or more objects within the electronic design or layout data and resistance or capacitance computations for the one or more objects using a field solver, which analytically solves the electronic design.

13. The computer program product of claim 1 wherein performing of the electrical analysis occurs during the design process when the electronic design is being created.

14. The computer program product of claim 1 wherein the model comprises a mathematical mapping of a geometric description of conductor configurations, shapes or patterns to electrical analysis parameters such as capacitance or resistance.

15. The computer program product of claim 1 wherein the electrical analysis comprises estimation of capacitance or resistance parameters.

16. A method for performing real-time electrical analysis of an electronic design, the method comprising:
   using at least one processor to perform the process, the process comprising:
   receiving design information for the electronic design;
   performing electrical analysis for one or more objects within the electronic design based at least in part on a description of conductor configurations and a mathematical model;
   selecting one or more conductor configurations, shapes, or patterns;
   performing a learning mode to improve-estimates made by an extraction component, which estimates a parasitic characteristic of at least some of the one or more conductor configurations, shapes, or patterns that are identified based at least in part upon results of performing the electrical analysis; and
   generating a modified mathematical model based at least in part upon the results of the learning mode.

17. The process of claim 16 further comprising using a field solver, which analytically solves the electronic design, to adjust or modify the mathematical model.

18. The process of claim 17 in which test data for the field solver is identified based upon distribution of the one or more conductor configurations within the electrical design.

19. The process of claim 18 in which a frequency of the one or more configurations within the electrical design is identified using a histogram or range of the one or more conductor configurations.

20. The process of claim 16 in which the model is modified by adding a conductor configuration and capacitance pairs to local memory.

21. The process of claim 16 in which timing calculation is performed using the modified model.

22. The process of claim 16 in which statistical analysis of computed capacitance and resistance are used with a field solver, which analytically solves the electronic design, to test an extractor and initiate the learning mode.

23. The process of claim 16 in which an estimator vector is used as a sensitivity function to produce a distribution of capacitance values as a function of estimated or measured variability.

24. The process of claim 16, in which a technology file description from an integrated circuit fabrication facility is used for the electrical analysis.

25. The process of claim 16 wherein the one or more conductor configurations comprises shape related information for a neighborhood of conductors around an object for which resistance and capacitance is computed.

26. The process of claim 16 wherein selecting the one or more conductor configurations, shapes or patterns is based at least in part on analysis of electronic design data related to the frequency of configurations, shapes or patterns within one or more interconnect layers or one or more electronic designs or at least in part on analysis of electronic design data related to electrical analysis model estimation errors for the configurations, shapes or patterns within one or more interconnect layers or one or more electronic designs.

27. The process of claim 16 wherein the model is created using a description of conductor configurations related to one or more objects within the electronic design or layout data and resistance or capacitance computations for the one or more objects using a field solver, which analytically solves the electronic design.

28. The process of claim 16 wherein performing of the electrical analysis occurs during the design process when the electronic design is being created.

29. The process of claim 16 wherein the model comprises a mathematical mapping of a geometric description of conductor configurations, shapes or patterns to electrical analysis parameters such as capacitance or resistance.

30. The process of claim 16 wherein the electrical analysis comprises estimation of capacitance or resistance parameters.

31. A system for performing real-time electrical analysis of an electronic design, comprising:
a processor communicatively coupled to a memory;
the memory comprising program code for executing a process which, when executed by the processor, causes the processor at least to:
receive design information for the electronic design;
perform electrical analysis for one or more objects within the electronic design based at least in part on a description of conductor configurations and a mathematical model;
select one or more conductor configurations, shapes or patterns;
perform a learning mode to improve estimates made by an extraction component, which estimates a parasitic characteristic of at least some of the one or more conductor configurations, shapes or patterns that are identified based at least in part upon results of performing the electrical analysis; and
generate a modified mathematical model based at least in part upon the results of the learning mode.

32. The system of claim 31 further comprising a field solver, which analytically solves the electronic design, to adjust or modify the model.

33. The system of claim 32 in which test data for the field solver is identified based upon distribution of the one or more conductor configurations within the electrical design.

34. The system of claim 31 wherein the model comprises a mathematical mapping of a geometric description of conductor configurations, shapes or patterns to electrical analysis parameters such as capacitance or resistance.

35. The system of claim 31 in which the model is modified by adding a conductor configuration and capacitance pairs to local memory.

36. The system of claim 31 in which timing calculation is performed using the modified model.

37. The system of claim 31 in which statistical analysis of computed capacitance and resistance are used with a field solver, which analytically solves the electronic design, to test an extractor and initiate the learning mode.

38. The system of claim 31 in which an estimator vector is used as a sensitivity function to produce a distribution of capacitance values as a function of estimated or measured variability.

39. The system of claim 31, in which a technology file description from an integrated circuit fabrication facility is used for the electrical analysis.

40. The system of claim 31 wherein the one or more conductor configurations comprises shape related information for a neighborhood of conductors around an object for which resistance and capacitance is computed.

41. The system of claim 31 wherein selecting the one or more conductor configurations, shapes or patterns is based at least in part on analysis of electronic design data related to the frequency of configurations, shapes or patterns within one or more interconnect layers or one or more electronic designs or at least in part on analysis of electronic design data related to electrical analysis model estimation errors for the configurations, shapes or patterns within one or more interconnect layers or one or more electronic designs.

42. The system of claim 31 wherein the model is created using a description of conductor configurations related to one or more objects within the electronic design or layout data and resistance or capacitance computations for the one or more objects using a field solver, which analytically solves the electronic design.

43. The system of claim 31 wherein performing of the electrical analysis occurs during the design process when the electronic design is being created.

44. A system for performing real-time electrical analysis of an electronic design, comprising:
at least one processor;
means for receiving design information for the electronic design;
means for performing electrical analysis for one or more objects within the electronic design based at least in part on a description of conductor configurations and a mathematical model;
means for selecting one or more conductor configurations, shapes, or patterns;
means for performing a learning mode to improve estimates made by an extraction component, which estimates a parasitic characteristic of at least some of the one or more conductor configurations, shapes, or patterns that are identified based at least in part upon results of performing the electrical analysis, and means for generating a modified mathematical model based at least in part upon the results of the learning mode.

45. The system of claim 44, the means for performing a learning mode comprising:

means for identifying a test set based at least in part upon the one or more conductor configurations, shapes, or patterns;

means for determining, by invoking a filed solver that analytically solves the electronic design, an analytic version of the parasitic characteristic;

means for identify an estimate of the parasitic characteristic that is estimated by the extraction component; and means for adjusting the extraction component based at least in part upon the estimate and the analytic version of the parasitic characteristic.

46. The system of claim 45, in which the test set includes one or more electrical characteristics associated with the one or more conductor configurations, shapes, or patterns.

47. The system of claim 45, in which the test set includes geometric description of at least some of the one or more conductor configurations, shapes, or patterns.

48. The system of claim 45, the process for performing the electrical analysis comprising:

means for providing the test set to the field solver to determine the analytic version of the parasitic characteristic; and means for providing the test set to the extractor component to determine the estimate of the parasitic characteristic.

49. The system of claim 44, the means for performing a learning mode further comprising:

means for identifying a set of layout configurations for evaluation;

means for identifying or determining one or more test sets based at least in part upon the evaluation; and means for identifying or determining a region in the electronic circuit.

50. The system of claim 44, the process further comprising:

means for determining a mapping between the parasitic characteristic and at least one of the at least some of the one or more conductor configurations, shapes, or patterns; and means for evaluating the mapping to identify a test set for improving the extraction component.

* * * * *